United States Patent [19]
Talbot et al.

[11] Patent Number: 5,616,921
[45] Date of Patent: Apr. 1, 1997

[54] SELF-MASKING FIB MILLING

[75] Inventors: Christopher G. Talbot, Menlo Park; Douglas Masnaghetti; Hongyu Ximen, both of San Jose, all of Calif.

[73] Assignee: Schlumberger Technologies Inc., San Jose, Calif.

[21] Appl. No.: 268,790

[22] Filed: Jun. 30, 1994

Related U.S. Application Data

[63] Continuation-in-part of Ser. No. 84,532, Jun. 28, 1993, abandoned.

[51] Int. Cl.⁶ .................................................. H01J 37/30
[52] U.S. Cl. .................. 250/307; 250/309; 250/492.21; 438/8; 204/192.33
[58] Field of Search .......................... 250/492.21, 398, 250/309, 307; 437/173, 235

[56] References Cited

U.S. PATENT DOCUMENTS

| | | | |
|---|---|---|---|
| 3,787,720 | 1/1974 | Kiewit | 250/398 |
| 3,881,108 | 4/1975 | Kondo et al. | 250/309 |
| 4,503,329 | 3/1985 | Yamaguchi et al. | |
| 4,717,681 | 1/1988 | Curran | 437/31 |
| 4,924,104 | 5/1990 | Stengl et al. | 250/309 |
| 4,961,178 | 10/1990 | Matsuda et al. | 269/103 |
| 5,004,927 | 4/1991 | Nakagawa | 250/492.21 |
| 5,035,787 | 7/1991 | Parker et al. | 250/492.21 |
| 5,055,696 | 10/1991 | Haraichi et al. | |
| 5,086,015 | 2/1992 | Itoh et al. | 250/492.21 |
| 5,086,230 | 2/1992 | Adachi et al. | 250/492.21 |
| 5,140,164 | 8/1992 | Tabbot et al. | |
| 5,439,763 | 8/1995 | Shimase et al. | 250/492.2 |

*Primary Examiner*—Bruce C. Anderson
*Attorney, Agent, or Firm*—Bruce D. Riter

[57] ABSTRACT

Preferential etching during FIB milling can result in a rough, pitted surface and make IC probing/repair operations difficult. Preferential etching is compensated by acquiring a contrast image of the partially-milled sample, preparing mask image data from the contrast image, and controlling further FIB milling using the mask image data. For example, a window is to be milled in a top-layer power plane of an IC to expose a hidden layer. The window is partially milled. A FIB image is acquired and thresholded to produce mask image data. The mask image data distinguish areas where the power plane has been milled through from those where it has not been milled through. Milling is resumed using the mask image data to control effective FIB milling current. The mask image data are updated periodically as the window is milled.

27 Claims, 22 Drawing Sheets

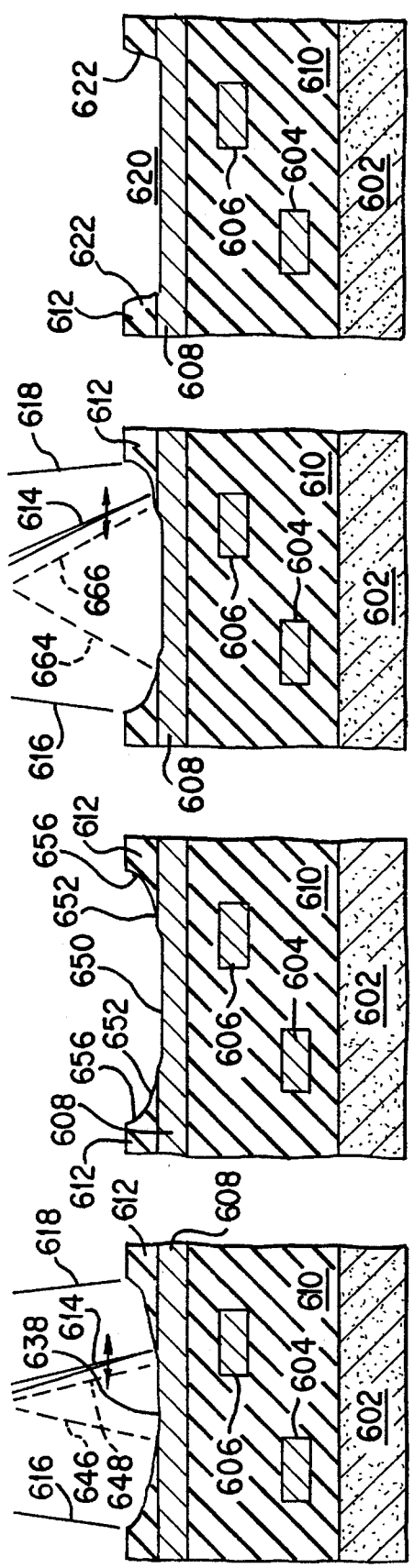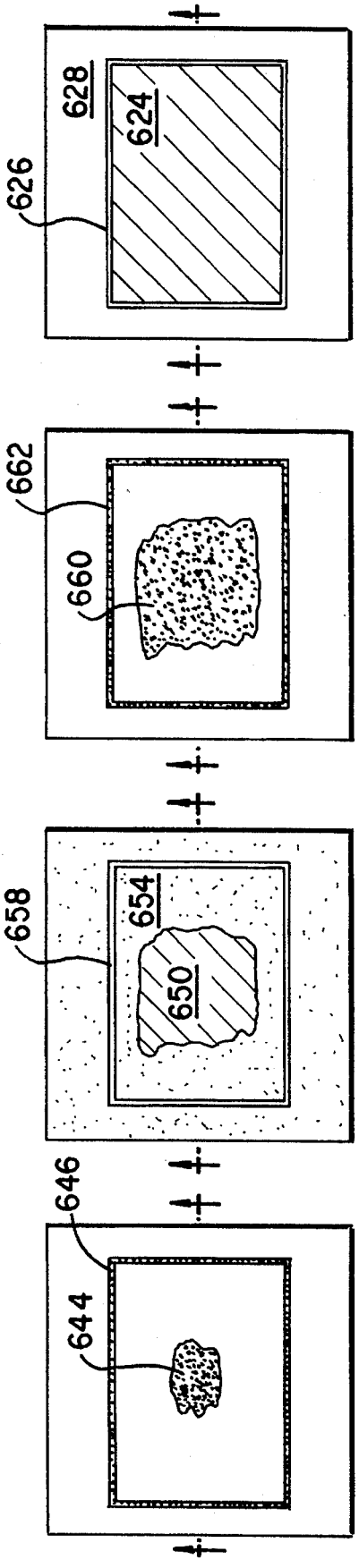

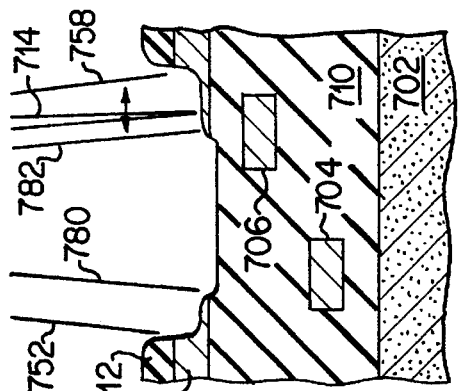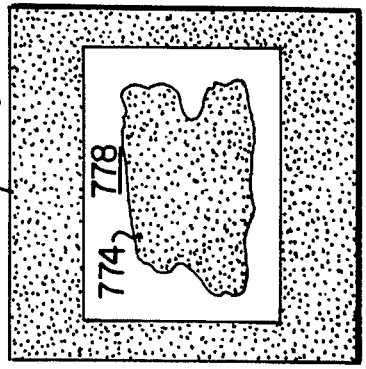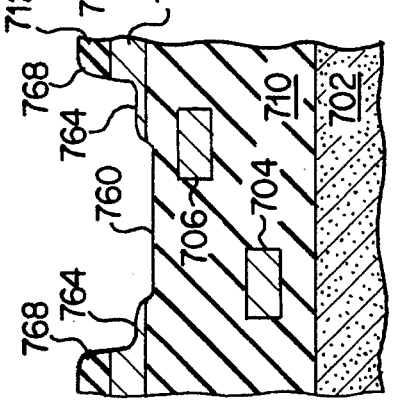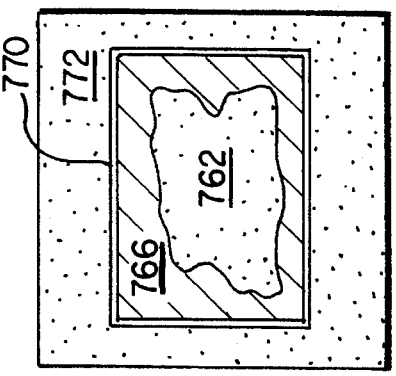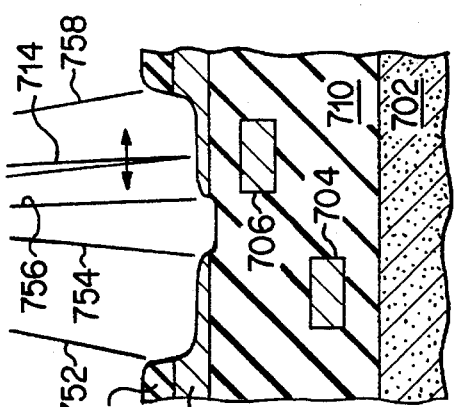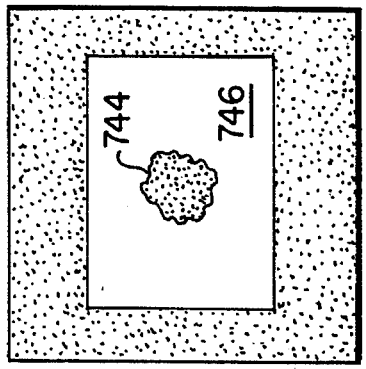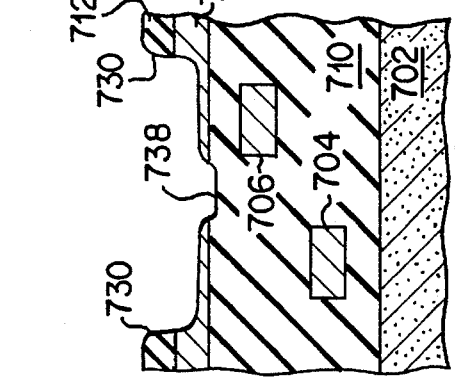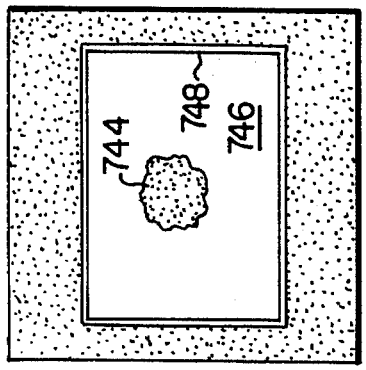

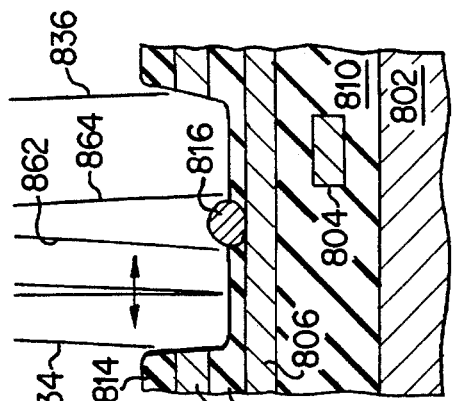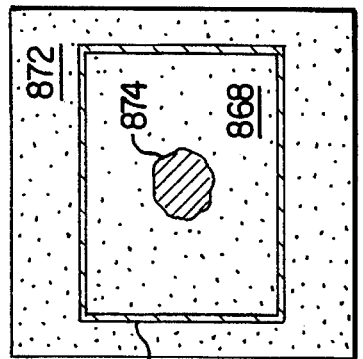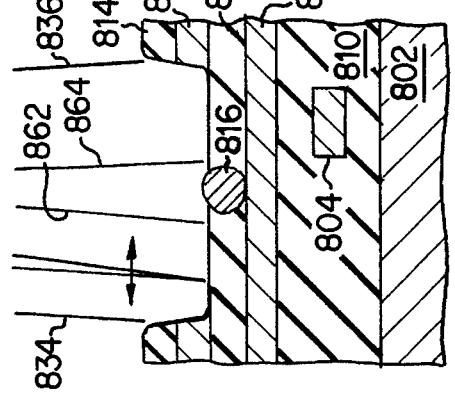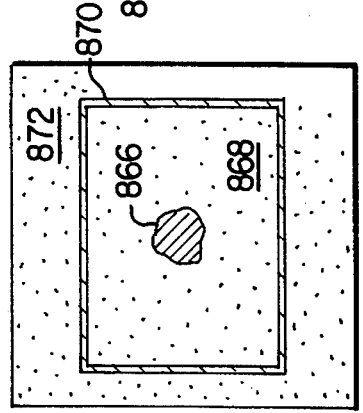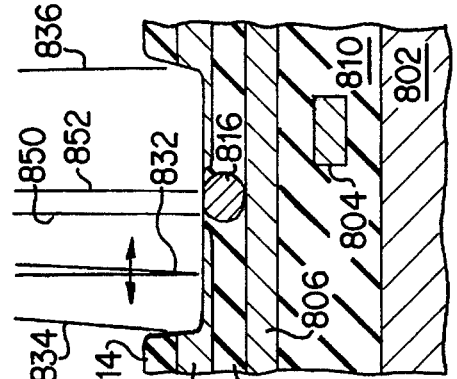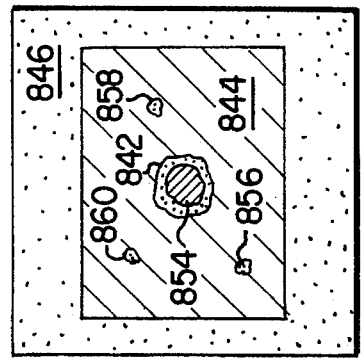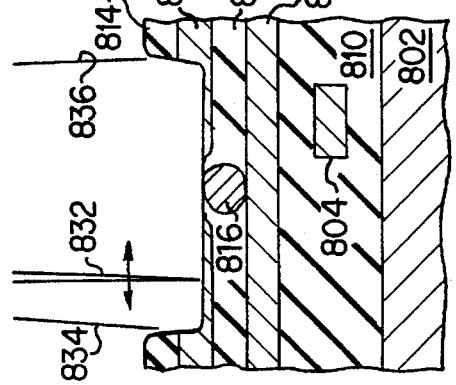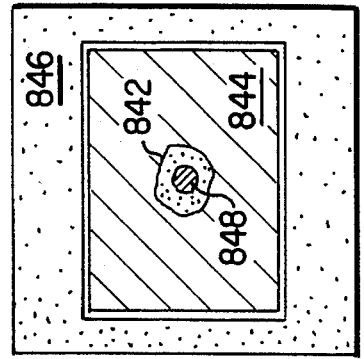

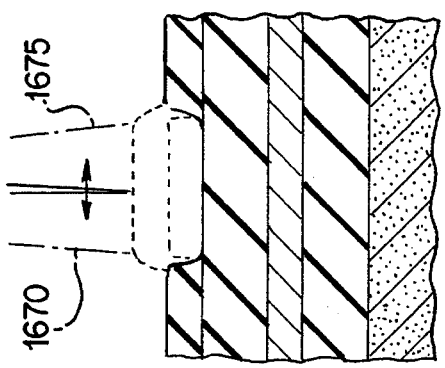
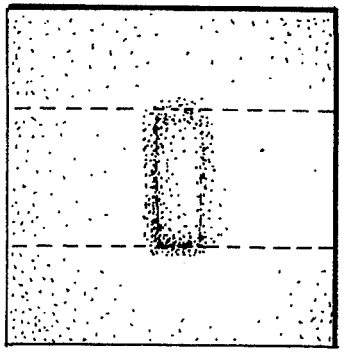
FIG. 16d  FIG. 16e  FIG. 16f
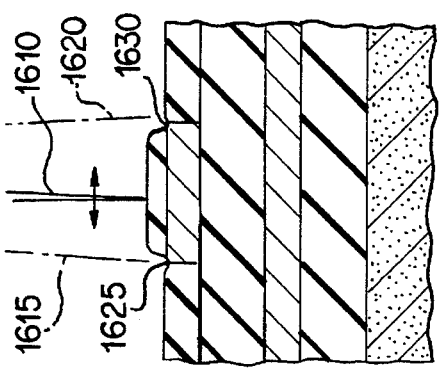
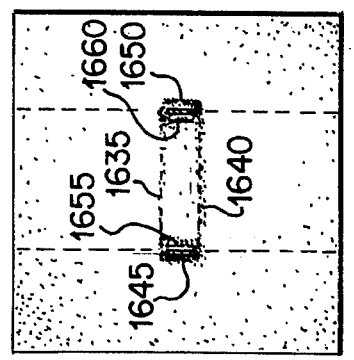
FIG. 16a  FIG. 16b  FIG. 16c
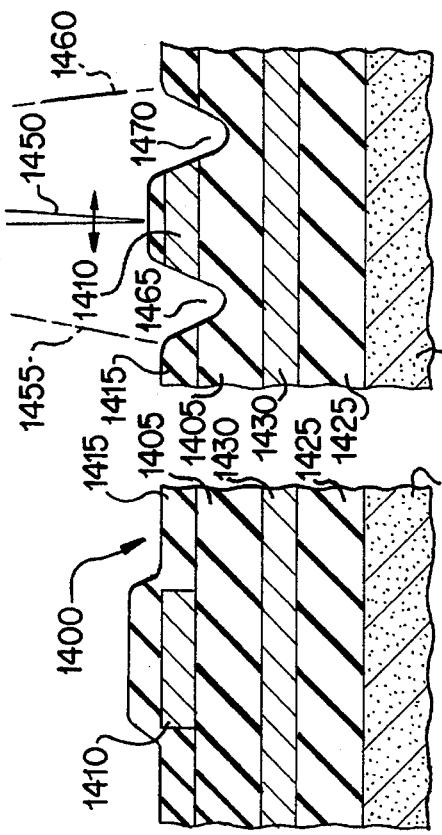
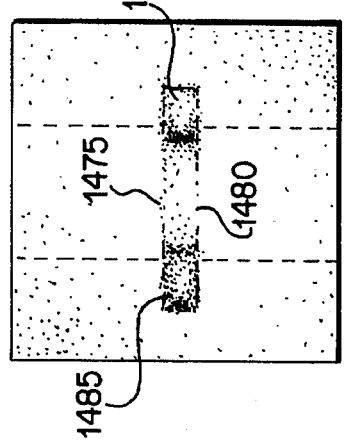
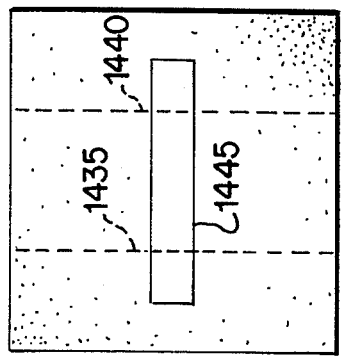
FIG. 14c  FIG. 14d
FIG. 14a  FIG. 14b

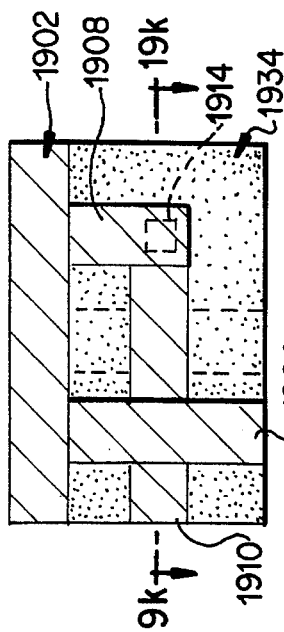
FIG. 19j
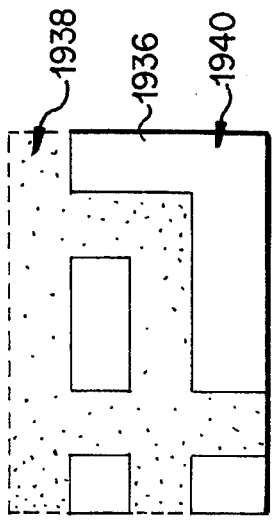
FIG. 19k
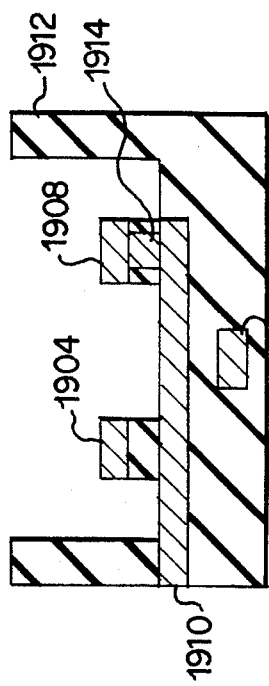
FIG. 19l
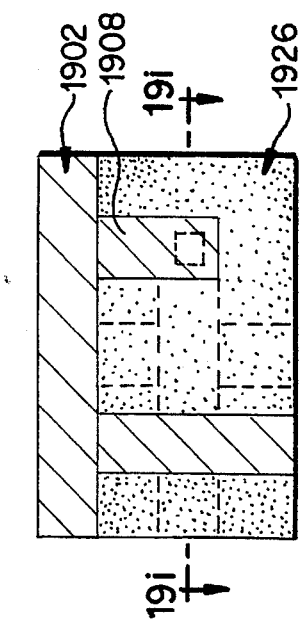
FIG. 19g
FIG. 19h
FIG. 19i 5,616,921

SELF-MASKING FIB MILLING

This is a continuation-in-part of pending U.S. application Ser. No. 08/084,532, filed Jun. 28, 1993 abandoned, the content of which is incorporated herein by this reference.

BACKGROUND OF THE INVENTION

1. Field of the Invention

The present invention relates to charged-particle beam processing. In particular, the present invention relates to methods of controlling milling of a specimen using a charged-particle beam such as a focused-ion beam (FIB).

2. The Prior Art

IC devices having three to five or more metal layers are increasingly common. With planarized devices, underlying layers are hidden and buried conductors are difficult to locate. Power planes can cover large areas of the IC, especially with advanced, highly integrated logic devices such as microprocessors. FIG. 1a illustrates in cross-section (not to scale) a portion of such a device having a silicon substrate 100 with diffusion regions 110, 120, a first metal layer M1, a second metal layer M2, a third metal layer M3, a fourth metal layer M4, dielectric 130, and passivation 140. Layer M4 is a power plane under which are hidden conductors or layers M3, M2 and M1.

It is frequently necessary to cut windows in top-layer power planes to expose lower-level signal conductors for probing (e.g., with electron-beam and/or mechanical probes) and/or for making repairs (e.g., with FIB and/or laser systems). It is also sometimes desired to mill a hole down to a metal layer, stopping the milling when the metal is exposed in the desired area. FIG. 1b illustrates an idealized window 150 (not to scale) cut through passivation 140, layer M4 and dielectric 130 to expose a conductor 160 of the device of FIG. 1a.

A FIB is commonly used for these purposes, despite the uneven surfaces often produced. Holes or pits result from preferential etching or milling at varying rates. These can be caused by edges in surface topography, inhomogeneities in underlying layer(s), differing crystal orientations or grain structures in the material being milled, and other factors. The surface inside or under the window becomes extremely rough and can in some cases limit or prevent further operations or repair. Variations from device fabrication process to process and even from device to device can be extreme. Milling of tungsten can be especially difficult to manage because tungsten mills more slowly than other materials and because different grain orientations appear to mill at different rates. Adequate windows can often be milled if the operator is sufficiently skilled, but sometimes the pitting effect is so extreme that further milling operations become difficult or impossible. While a skilled operator may be able to cope with the uneven milling (for example, by suitably tilting the sample), it would be preferable to avoid the need for a skilled operator.

FIG. 1c show an example of a problem which can arise with FIB milling. As passivation layer 140 is milled, the surface 170 of the milled passivation becomes pitted and uneven. FIG. 1d illustrates a typical result as FIB milling continues through layer M4. The metal at the bottom of the window 180 is partially milled through, leaving islands of metal amid regions where dielectric 130 is exposed.

FIG. 2 is a FIB image of portion of a device which has been sectioned. The image has been enhanced with solid lines to emphasize materials transitions. Visible in FIG. 2 are silicon substrate 210, a silicon oxide layer 215, a metal-2 layer 220 of tungsten, a metal-3 layer formed as a sandwich of tungsten 225 and aluminuna 230, a silicon oxide layer 235, $Si_3N_4$ passivation 240, tungsten vias 245, 250 and 255 between the metal-2 and metal-3 layers, and silicon oxide regions 260, 265, 270 and 275. The aluminum 230 and tungsten 225 of the metal-3 layer are lumpy and of uneven thickness, not conducive to milling an ideal window for exposing a conductor of the metal-2 layer.

FIG. 3 is a FIB image of the device of FIG. 2 after a FIB has been used to begin milling a window 300 of about 20×25 microns. The passivation 280 is visible in the area surrounding window 300. Within the window, the brightest areas 310 are aluminum, the darker gray areas 320 are tungsten, and the darkest areas 330 are dielectric visible where the FIB has cut entirely through the metal-2 layer. The edge of the window appears as a bright line 340.

FIG. 4 is a FIB image of the device of FIG. 3 after further FIB milling of window 300. The device is tilted to better show edges of the window and the milled surface. The unmilled surface of passivation layer 280 is rough, unlike the idealized drawings of FIGS. 1a–1d. Within window 300, craters and pits extend down to the (dark) dielectric material below the (bright) metal layer, while islands of the metal-3 layer remain. Edges of window 300 and edges around the craters appear bright. Preferential milling of edges has made the milled surface pitted and uneven.

Repair of a device sometimes calls for FIB milling to cut a conductor. FIG. 14a shows an idealized schematic section (not to scale) of a portion 1400 of an IC having a dielectric layer 1405 below and a passivation layer 1415 covering dielectric layer 1405 and a metal-2 power bus conductor 1410. FIG. 14a also shows a substrate 1420, a dielectric layer 1425 and a metal-1 conductor 1430. FIG. 14b is a top view showing a portion of the IC much as it would appear in a FIB image, with the edges of conductor 1410 visible as topographical contrast in the image along lines 1435 and 1440. If it is desired to isolate the power bus by cutting conductor 1410, the FIB-system operator defines a "cut box" on a displayed FIB image to establish the boundaries of a region to be milled. Such a "cut box" is shown at 1445 in FIG. 14b. FIB milling is then controlled to mill only the region within the "cut box", that is, by scanning a FIB 1450 between scan limits 1455 and 1460 as shown in the sectional view of FIG. 14c.

A typical result of such a milling operation is also shown in FIG. 14c. Topographical relief in passivation layer 1415 at the edges of conductor 1410 lead to preferential milling, resulting in deep pits 1465, 1470 at each end of the milled region while conductor 1410 is not yet milled through. FIG. 14d is a top view showing a portion of the IC much as it would appear in a FIB image, with the edges of the milled region visible as topographical contrast along lines 1475 and 1480 and with the steep walls of pits 1450 and 1455 visible in the image as topographical contrast and partially as materials contrast at regions 1485 and 1490, respectively. Continued milling in this fashion may extend pits 1450, 1455 into other structure and possibly damage the IC.

FIG. 15 is an actual FIB image of a trench milled to cut a power bus using such a prior-art method of FIB milling. The image is enhanced with inked lines to emphasize contrast features. Visible at 1505 and 1510 are regions of passivation overlying a conductor. Edges of the milled trench are visible as contrasting areas at 1515 and 1520. Unwanted, deep pits at each end of the milled trench are seen at 1525 and 1530. A technique employed by some FIB-system operators to reduce the amount of pitting at the ends of the trench is to begin milling, then acquire and examine a contrast image of a region including the trench, then manually reduce the boundaries of the "cut box" to avoid deepening the pits during further milling. Among other drawbacks, such a conductor-cutting operation is time-consuming and the result is dependent on the skill of the operator.

Chemically-assisted ion beam etching (CAIBE) can sometimes be used to improve the quality of the milled surface. With CAIBE, a jet of a suitable chemical is directed at the surface location where the ion beam is applied. However, CAIBE of uneven surfaces or composite structures can result in "islands" of material projecting from the milled surface.

SUMMARY OF THE INVENTION

The present invention offers methods and apparatus for compensating the preferential milling which occurs when milling a sample with a charged-particle beam such as a FIB, thus minimizing unevenness of the milled surface. The methods and apparatus are particularly suitable for FIB modification and repair of IC devices. In accordance with preferred embodiments, an image of the surface to be milled is used to generate mask data used to control FIB milling.

For example, a FIB system is operated in accordance with the invention to mill a window through an upper-layer power plane to expose a hidden layer. The window is partially milled. An image (e.g., a FIB or SEM image) of the milled region is acquired and thresholded to form a mask image. The mask image distinguishes areas where the power plane has been milled through from those where it has not. Milling is resumed using the mask image to control the FIB. The mask is updated from time to time until milling is completed.

These and other features of the invention will become apparent to those of skill in the art from the following description and the accompanying drawing figures.

BRIEF DESCRIPTION OF THE DRAWING

FIGS. 14a–14d illustrate FIB milling to isolate a power bus in accordance with a prior art method;

FIGS. 16a–16f illustrate a method of self-masked FIB milling to isolate a power bus in accordance with the present invention;

DESCRIPTION OF PREFERRED EMBODIMENTS

A FIB system suitable for carrying out the methods of the present invention is the IDS 7000 FIBstation™, available commercially from Schlumberger Technologies, Inc., of San Jose, Calif.. Such a system is described, for example, in U.S. Pat. No. 5,140,164 to Talbot et al., the content of which is incorporated herein by this reference.

Figure 5:
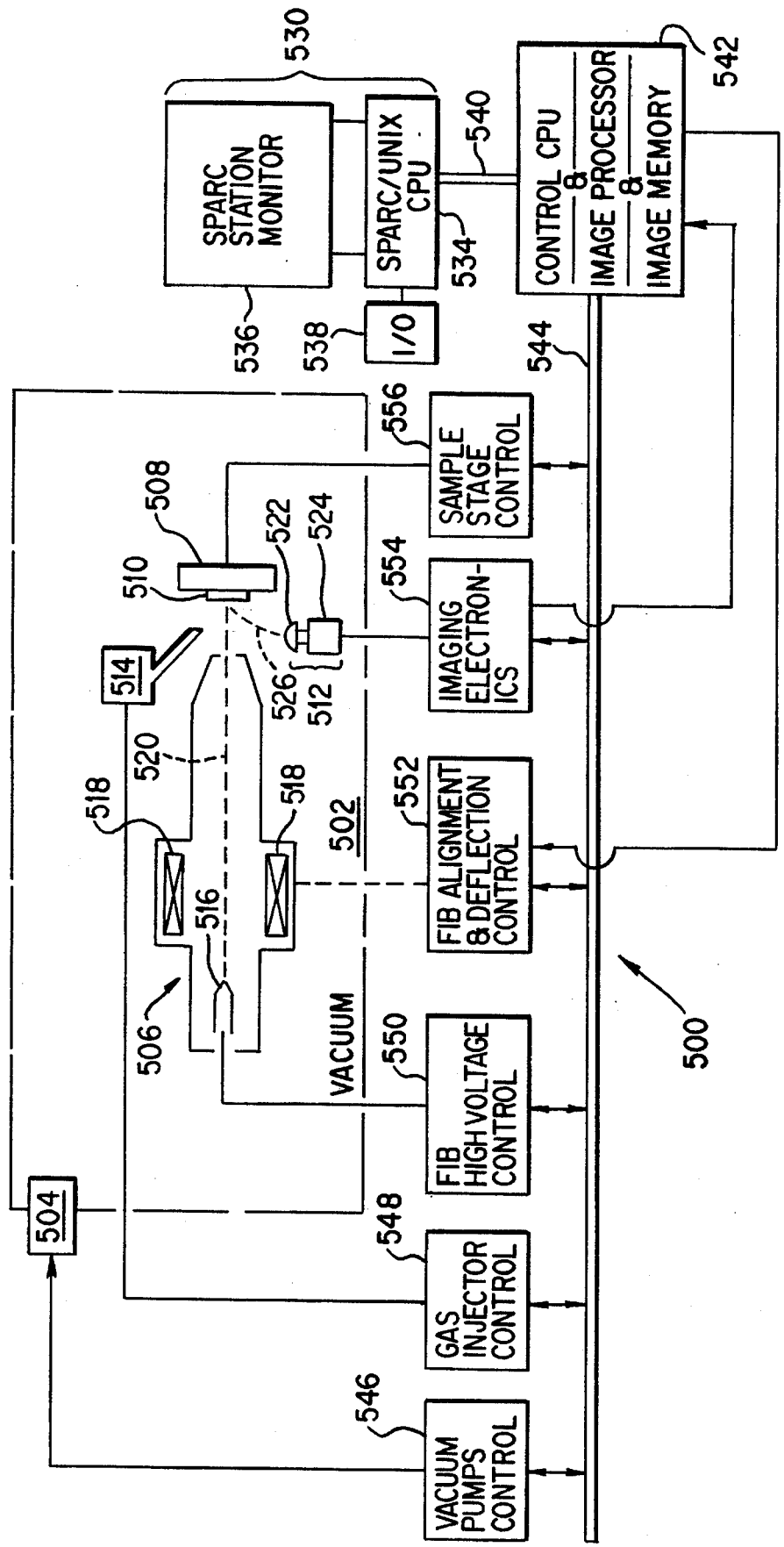
FIG. 5 is a schematic illustration of a FIB system.

FIG. 5 schematically illustrates such a system. A vacuum chamber 502 evacuated by pumps 504 encloses a FIB column 506, a specimen stage 508 for holding a specimen 510 such as an IC device to be repaired, a detector 512, and a gas injector 514. Column 506 includes an ion source 516, and ion-optical elements 518 for controlling alignment and deflection of an ion beam 520. Detector 512 may comprise a scintillator 522 and a photo-multiplier tube 524 for detecting secondary electrons 526 emitted when ion beam 520 impinges on specimen 510.

The system includes a workstation 530 having a processor unit (CPU) 532, a monitor 534 and input/output (I/O) devices 538 such as a keyboard and/or mouse. Workstation 530 is linked by a bus 540 to a system control unit 542 comprising a control CPU, an image processor and image memory. System control unit 542 communicates via a bus 544 with a vacuum-pumps control 546 for controlling vacuum pumps 504, with gas injector control 548 for controlling gas injector 514, with FIB high-voltage control 550 for controlling ion source 516, with FIB alignment & deflection control 552 for controlling ion optical elements 518, with imaging electronics 554 which receive a detector signal from detector 512, and with specimen-stage control 556 for controlling specimen stage 508 to position specimen 510. System control unit 542 preferably receives image information from imaging electronics 554 and, after image processing such as described below, supplies beam control information to FIB alignment and deflection control 552.

In operation, a specimen 510 is placed in vacuum chamber 502. Chamber 502 is evacuated. Under control of system control unit 542, FIB 520 is scanned over a selected region of the specimen to mill away material by sputtering. With commercial systems in use today, milling is typically conducted at a FIB current in the range of 50 pA to 6 nA. After milling for some time, FIB current is preferably reduced, the FIB is scanned for imaging, a secondary-particle detector signal is supplied by detector 512 to imaging electronics 554, and a resulting FIB image of specimen 510 is acquired and stored in image memory. Reducing FIB current for imaging results in a smaller FIB spot size and thus provides better image resolution. Pixel values of the FIB image are thresholded to produce a binary image, and the binary image is used as a "mask" to control FIB 520 for milling during a further time interval. Depending on implementation specifics, changing the beam current may produce an image offset which is corrected by alignment. Alignment may be effected by comparing an image acquired at imaging (low) beam current with an image acquired at milling (high) beam current to determine offset values, or by applying an offset determined in advance from calibration of the system. It is assumed in the examples which follow that alignment is performed as necessary when switching between imaging current and milling current. The mask can be updated from time to time by acquiring a fresh FIB image and thresholding. Updating the image makes the process adaptive to the circumstances and thus makes it a closed-loop process.

Figure 6A:
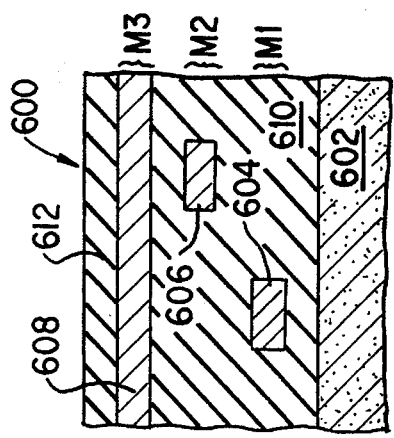
FIGS. 6a–6p illustrate a method of self-masked FIB milling in accordance with a preferred embodiment of the invention.
Figure 6C:
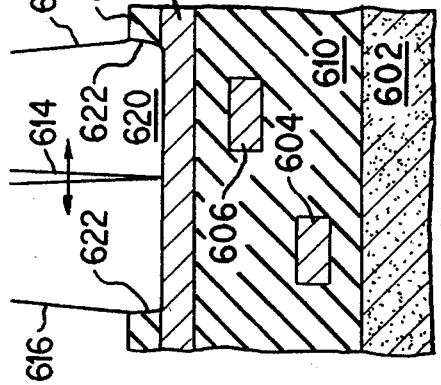

An example is illustrated in FIGS. 6a–6p. FIG. 6a shows an idealized schematic section (not to scale) of a portion 600 of a typical IC having a silicon substrate 602, a conductor 604 of a first metal layer M1, a conductor 606 of a second metal layer M2, a plane 608 such as a power or ground plane of a third metal layer M3, dielectric 610, and passivation 612. FIG. 6b is a top view showing a portion of the IC much as it would appear in a FIB image, and also showing hidden conductors 604 and 606 in dashed lines.

In this example, a window is to be milled in passivation 612 to give access to layer M3. Referring to FIG. 6c, the milling is conducted by scanning FIB 614 over a region of the IC between scan limits 616 and 618 with the goal of producing a window 620 having lateral walls 622. FIG. 6d is a top view showing a portion of the IC much as it would appear in a FIB image, with window 620 appearing as a bright region 624 of metal 608 surrounded by bright peripheral edges 626 corresponding to walls 622 and by a darker region 628 corresponding to passivation 612. In a typical FIB image display, metal would appear bright while passivation and dielectric would appear dark; for convenience of illustration, metal is shown cross-hatched while passivation and dielectric are shaded.

Figure 6E:
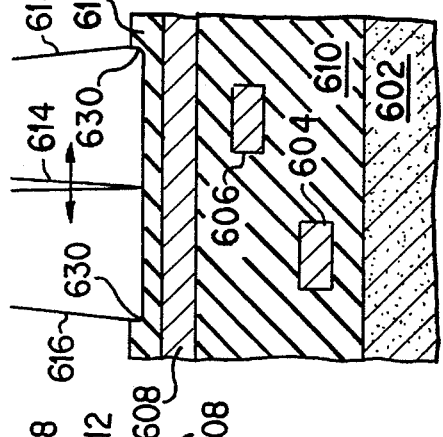

FIG. 6e shows the beginning of the milling operation, with FIB 614 being scanned between limits 616 and 618 to remove passivation material. FIG. 6f is a top view showing a portion of the IC much as it would appear in a FIB image acquired after milling to the extent shown in FIG. 6e. In FIG. 6f, the passivation visible within the window area at 632 and surrounding the window area at 634 are dark, but edges 630 of the incipient window appear as a bright line 636 about the periphery of the milled region.

Figure 6G:
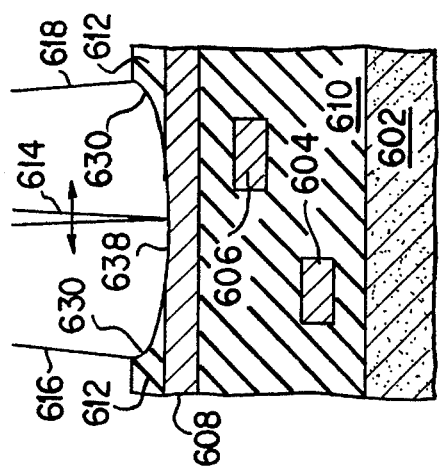
Figure 6B:
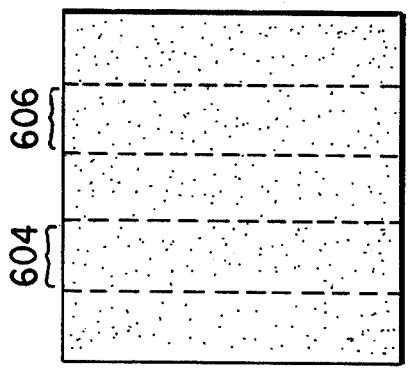
Figure 6D:
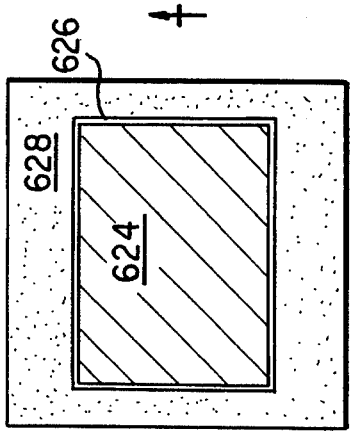
Figure 6F:
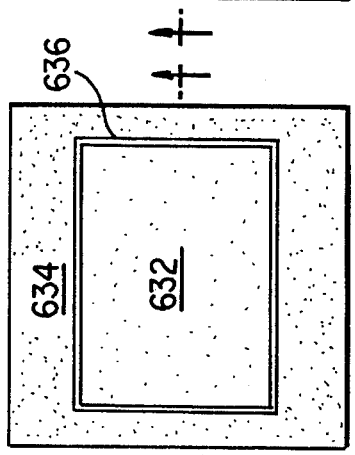
Figure 6H:
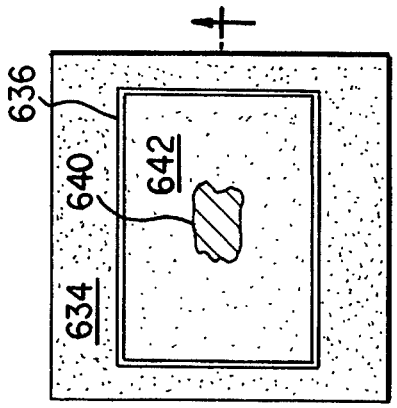

FIG. 6g shows the result of continued milling. Uneven milling causes the M3 layer to be exposed in one or more irregular areas 638 while passivation 612 remains over much of the window area. FIG. 6h is a top view showing a portion of the IC much as it would appear in a FIB image acquired after milling to the extent shown in FIG. 6g. In FIG. 6h, the exposed area of the M3 layer appears as a bright spot 640, while surrounding passivation appears as a darker region 642. Edges 630 appear as a bright line 636 about the periphery of the milled region.

The FIB image of FIG. 6h can be readily stored and the pixel intensity values thresholded to produce a stored binary image. FIG. 6j is a view of such an image. Bright metal area 640 and bright edge area 636 of FIG. 6h are transformed to a solid black area 644 and a solid black line 646, respectively, while passivation regions become white. For convenience of illustration, metal is shown as black and passivation as white in FIG. 6j. The opposite convention could be adopted if desired when binarizing the pixel values.

FIG. 6i illustrates use of the binarized image data represented in FIG. 6j as a mask to control further milling. The objective is to continue FIB milling of passivation within the window area while avoiding or minimizing further milling of the exposed metal within the window area. Referring to FIG. 6i, the objective is to mill between limits 616 and 646 and between limits 648 and 618, while minimizing further milling between limits 646 and 648. This can be implemented by any of a variety of methods. For example, FIB 614 can be blanked between limits 646 and 648 as it is scanned between limits 616 and 618. Alternatively, the scan rate of FIB 614 can be altered so that a relatively slow scan rate normally used for milling between limits 616 and 618 is greatly increased between limits 646 and 648. These and other methods of selectively altering the milling pattern are described in more detail below.

FIG. 6k shows the result of selective milling as described with reference to FIG. 6i. FIG. 6l shows the IC much as it would appear in an updated FIB image, acquired after milling to the extent shown in FIG. 6k. Exposed M3 metal area 650 is now substantially larger than previously exposed metal area 638, yet the area is not deeply cratered. Surrounding passivation 652 appears as a darker region 654. Edges 656 appear as a bright line 658 about the periphery of the milled region.

FIG. 6l can be stored and the pixel intensity values thresholded to produce a stored binary image. FIG. 6n is a view of such an image. Bright metal area 650 and bright edge area 658 of FIG. 6l are transformed to a solid black area 660 and a solid black line 662, respectively, while passivation regions become white. As with FIG. 6j, metal is shown as black and passivation as white in FIG. 6n for convenience of illustration.

FIG. 6m illustrates use of the binarized image data represented in FIG. 6n as a mask to control further milling. The objective is again to continue FIB milling of passivation within the window area while avoiding or minimizing further milling of the exposed metal. Referring to FIG. 6m, it is desired to mill between limits 616 and 664 and between limits 666 and 618, while minimizing further milling between limits 664 and 666. The result is a window 620 having walls 622 and a relatively flat central region of exposed M3 metal as shown in FIG. 6o, FIG. 6p is a top view showing a portion of the IC of FIG. 6o much as it would appear in a FIB image, with window 620 appearing as a bright region 624 of metal 608 surrounded by bright peripheral edges 626 corresponding to walls 622 and by a darker region 628 corresponding to passivation 612.

Figure 7G:
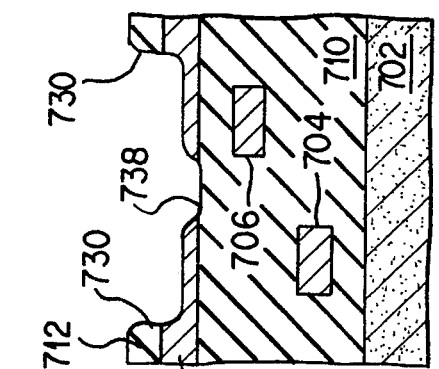
FIGS. 7a–7p illustrate a method of self-masked FIB milling in accordance with a further preferred embodiment of the invention.
Figure 7E:
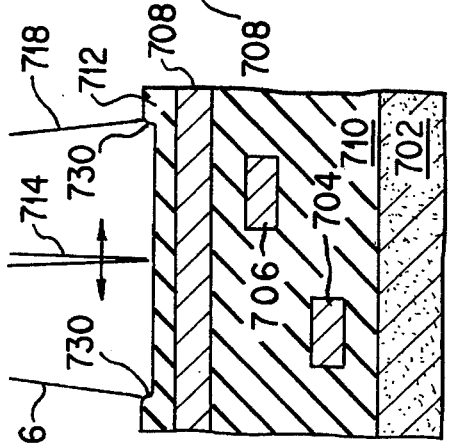
Figure 7C:
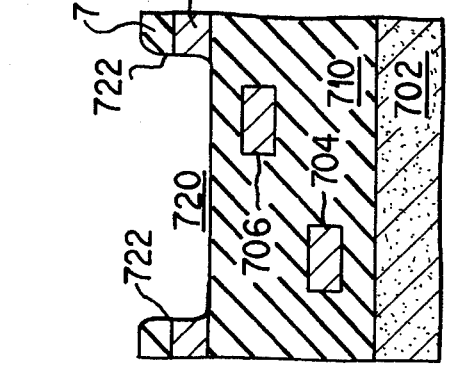
Figure 7A:
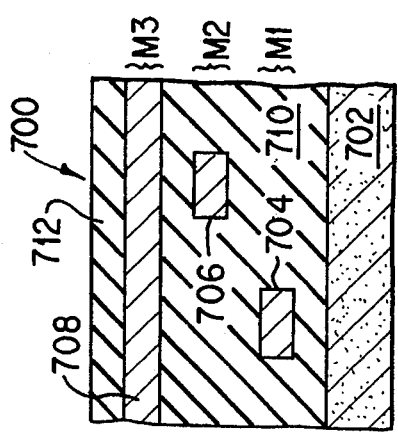
Figure 7H:
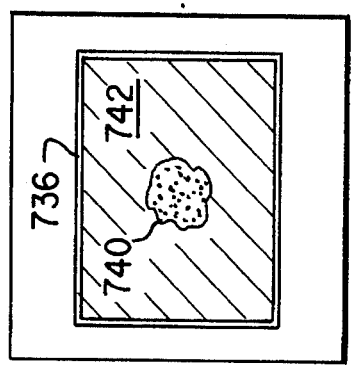
Figure 7F:
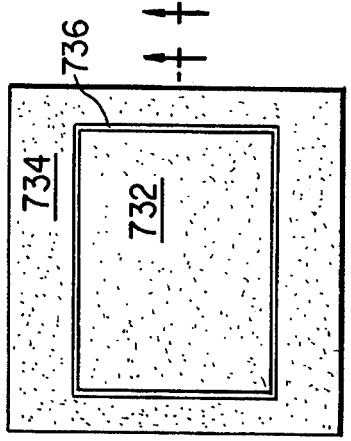
Figure 7D:
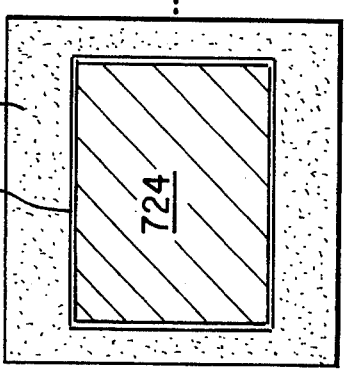
Figure 7B:
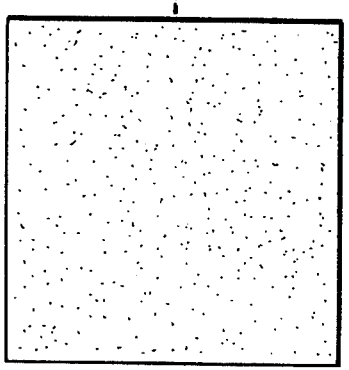

A further example is illustrated in FIGS. 7a–7p. FIG. 7a shows an idealized schematic section (not to scale) of a portion 700 of a typical IC having a silicon substrate 702, a conductor 704 of a first metal layer M1, a conductor 706 of a second metal layer M2, a plane 708 such as a power or ground plane of a third metal layer M3, dielectric 710, and passivation 712. FIG. 7b is a top view showing a portion of the IC much as it would appear in a FIB image.

In this example, a window is to be milled through passivation 712 and M3 metal layer 708 to give access to conductors of layers M2 and M1. FIG. 7c shows the desired window 720, and FIG. 7d shows the window much as it would appear in a FIB image. Window 720 appears as a bright region 724 of metal surrounded by bright peripheral edges 726 corresponding to walls 722 and by a darker region 728 corresponding to passivation 712.

FIG. 7e shows the beginning of the milling operation, with FIB 714 being scanned between limits 716 and 718 to remove passivation material. FIG. 7f is a top view showing a portion of the IC much as it would appear in a FIB image acquired after milling to the extent shown in FIG. 7e. Passivation visible within the window area at 732 and surrounding the window area at 734 are dark. Edges 730 of the incipient window appear as a bright line 736.

FIG. 7g shows the result of continued milling. Uneven milling causes dielectric 710 to be exposed at one or more irregular areas 738 while M3 metal 708 remains over much of the window area. FIG. 7h is a top view showing a portion of the IC much as it would appear in a FIB image acquired after milling to the extent shown in FIG. 7g. The exposed area of the dielectric layer appears as a dark spot 740, while surrounding M3 metal appears as a brighter region 742. Edges 730 appear as a bright line 736 about the periphery of the milled region.

The FIB image of FIG. 7h can be stored and the pixel intensity values thresholded to produce a stored binary image. FIG. 7j is a view of such an image in which passivation area 740 of FIG. 7h is transformed to a solid black area 744, surrounding metal region 742 is transformed to a solid white area 746, edges 730 are transformed to a solid white line 748, and passivation surrounding the window is transformed to black. FIG. 7i is the same as FIG. 7g, allowing comparison of the milled structure to the features of thresholded image 7j. In FIG. 7j, metal and edges are shown as white and passivation and dielectric are shown as black for convenience of illustration. The opposite convention could be adopted when binarizing the pixel values. FIG. 7l is a modification of the image of FIG. 7j in which line 748 corresponding to the bright edges 730 of the window has been masked out of the binarized image.

FIG. 7k illustrates use of the binarized image data represented in FIG. 7l as a mask to control further milling. The objective is to continue FIB milling of M3 metal within the window area while avoiding or minimizing further milling of the exposed dielectric within the window area. It may also be preferred to avoid further milling at the edges of the window. Referring to FIG. 7k, the objective is to mill between limits 752 and 754 and between limits 756 and 758, while minimizing further milling between limits 754 and 756. Limits 752 and 758 are somewhat inside of limits 716 and 718, respectively, in keeping with the desire to avoid further milling at the edges of the window.

FIG. 7m shows the result of selective milling as described with reference to FIG. 7k. FIG. 7n shows the IC much as it would appear in an updated FIB image, acquired after milling to the extent shown in FIG. 7m. Exposed dielectric area 760 is now substantially larger than previously exposed dielectric area 738 and appears as a dark regions 762. Surrounding M3 metal 764 appears as a bright region 766. Edges 768 appear as a bright line 770 about the periphery of the milled region. Passivation appears as a darker region 772.

FIG. 7n can be stored and the pixel intensity values thresholded to produce a stored binary image. FIG. 7p is a view of such an image. Dielectric area 762 and passivation area 772 of FIG. 7n are transformed to solid black area 774 and 776, respectively. Metal M3 region 766 of FIG. 7n becomes a white region 778. Border line 770 of FIG. 7n is transformed into a solid black line contiguous with region 776 so as to avoid further milling at the window edges.

FIG. 7o illustrates use of the binarized image data represented in FIG. 7p as a mask to control further milling. The objective is again to continue FIB milling of M3 metal within the window area while avoiding or minimizing further milling of exposed passivation. Referring to FIG. 7o, it is desired to mill between limits 752 and 780 and between limits 782 and 758, while minimizing further milling between limits 780 and 782. The result is a window 720 as shown in FIG. 7c.

Figure 8A:
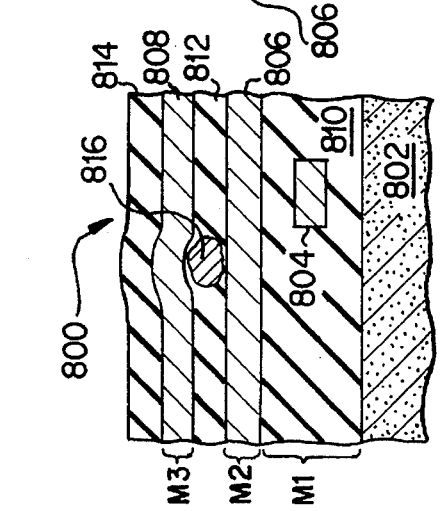
FIGS. 8a–8p illustrate a method of self-masked FIB milling in accordance with yet another preferred embodiment of the invention.
Figure 8B:
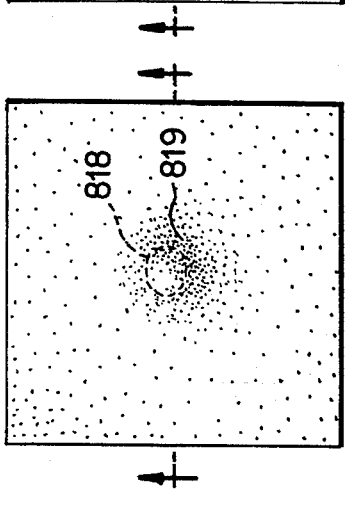

Yet another example is illustrated in FIGS. 8a–8p. FIG. 8a shows an idealized schematic section (not to scale) or a portion 800 of a typical IC having a silicon substrate 802, a conductor 804 of a first metal layer M1, a conductor 806 of a second metal layer M2, a plane 808 such as a power or ground plane of a third metal layer M3, dielectric layers 810 and 812, and passivation 814. Also present is a particle 816 (e.g., of tungsten) which became entrapped in the IC structure during fabrication. FIG. 8b shows a portion of the IC much as it would appear in a FIB image. The position of hidden particle 816 is shown in dashed lines 818 (though it would not be visible in a FIB image), while a raised area of passivation 814 appears shaded at 819.

Figure 8C:
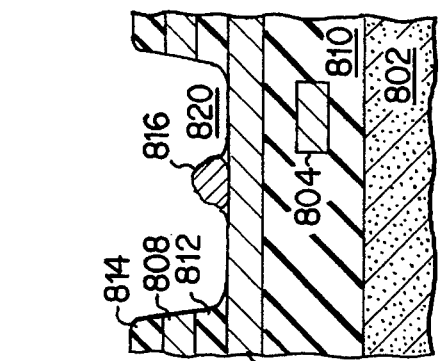
Figure 8D:
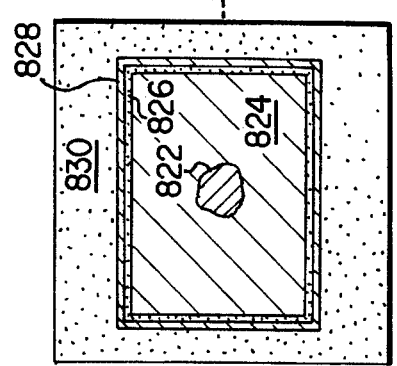

It is desired to expose particle 816 for examination or analysis, e.g., as an aid to diagnosing difficulties in the fabrication process. In general, composition of the particle is not known. FIG. 8c shows a window 820 which might be milled to expose particle 816. FIG. 8d shows window 820 much as it would appear in an image having some type of contrast between particle 816 and surrounding structure of the IC, such as an image in which atomic elements or molecular compounds making up the sample are distinguishable from one another. Such a contrast image can be produced, e.g., using secondary ion mass spectroscopy (SIMS) or Auger or EDX techniques. The Auger technique involves firing electrons having energy in the range of a few kV at the surface of the sample, and analyzing energy of rebounding (rather than secondary) electrons. Energy of the rebounding electrons is characteristic of the atomic elements with which the electrons interact. The EDX technique involves firing electrons at the sample so that electrons of atoms in the structure are excited into higher states. X-rays characteristic of the atomic elements are emitted when these electrons drop back to lower states. Other imaging techniques which provide contrast between the surrounding IC structure and particle 816 (e.g., a materials contrast image not necessarily distinguishing atomic elements) or an outline of particle 816 (e.g., a topographical contrast image) can be used. Whichever technique is used, the image of FIG. 8d shows particle 816 as a central circular region 822 (e.g., of tungsten), a rectangular window region 824 (e.g., of aluminum) with a dielectric border 826 (e.g., of $SiO_2$) and a metal border 828 (e.g., of aluminum), and surrounding passivation 830. The contrast image makes it possible to mill away the M3 layer without also milling away tungsten particle 816.

Figure 8E:
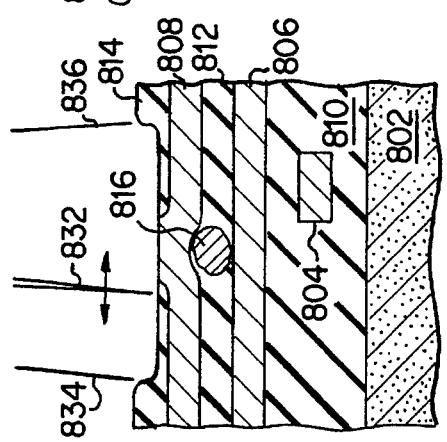
Figure 8F:
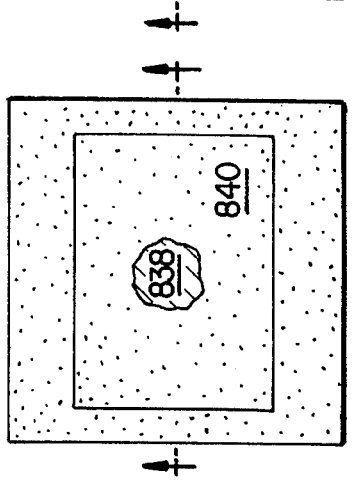
Figure 8G:
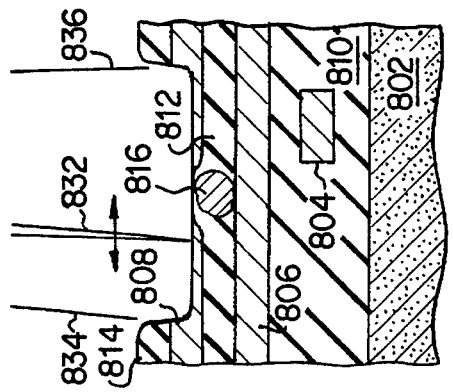
Figure 8H:
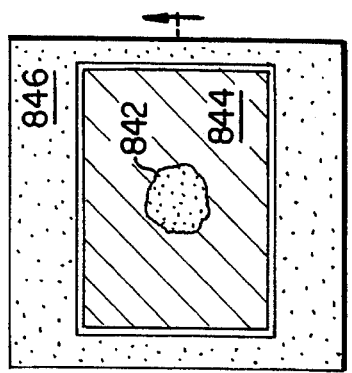

Milling commences as shown in the section of FIG. 8e by scanning FIB 832 between scan limits 834 and 836. Referring to the image of FIG. 8f, a portion 838 of M3 metal layer 808 overlying particle 816 is exposed while passivation 814 remains visible within the remainder 840 of the window and surrounding the window. Milling continues as shown in the section of FIG. 8g. Referring to the image of FIG. 8h, a circular region 842 of dielectric material 812 is visible at 842. Metal 808 is visible within the remainder 844 of the window, surrounded by passivation at 846. Milling continues further as shown in the section of FIG. 8i. Referring to the image of FIG. 8j, milling is stopped when particle 816 becomes visible at 848 in the center of dielectric region 842.

The image of FIG. 8*j* is then binarized such that pixels in the region where particle 816 is visible are set to a first value (e.g., black) and the remaining pixels are set to a second value (e.g., white). The binarized image is then used as a mask to control milling as shown in FIG. 8*k* so as to avoid further milling in region 848. That is, milling of the Window is continued between limits 834 and 850 and between limits 852 and 836, such that particle 816 is preserved. The image of FIG. 8*l* shows not only that more of particle 816 is visible at 854, but also areas 856, 858, 860 where dielectric 812 becomes visible through M3 metal layer 808. The image of FIG. 8*l* is then binarized for use as a mask to continue milling as shown in FIG. 8*m*, e.g., between limits 834 and 862 and between limits 864 and 836. The image of FIG. 8*n* shows particle 816 at 866, surrounded by a region 868 of dielectric, a periphery of M3 metal at 870, and passivation 814 at 872. FIG. 8*n* is binarized for use as a mask to control further milling as in FIG. 8*o*. The image of FIG. 8*p* shows still more of particle 816 visible at 874, and can be binarized for use as a mask to control further milling, and so on. By updating the mask from time to time, the particle 816 can be preserved while surrounding material is milled away.

Figure 9:
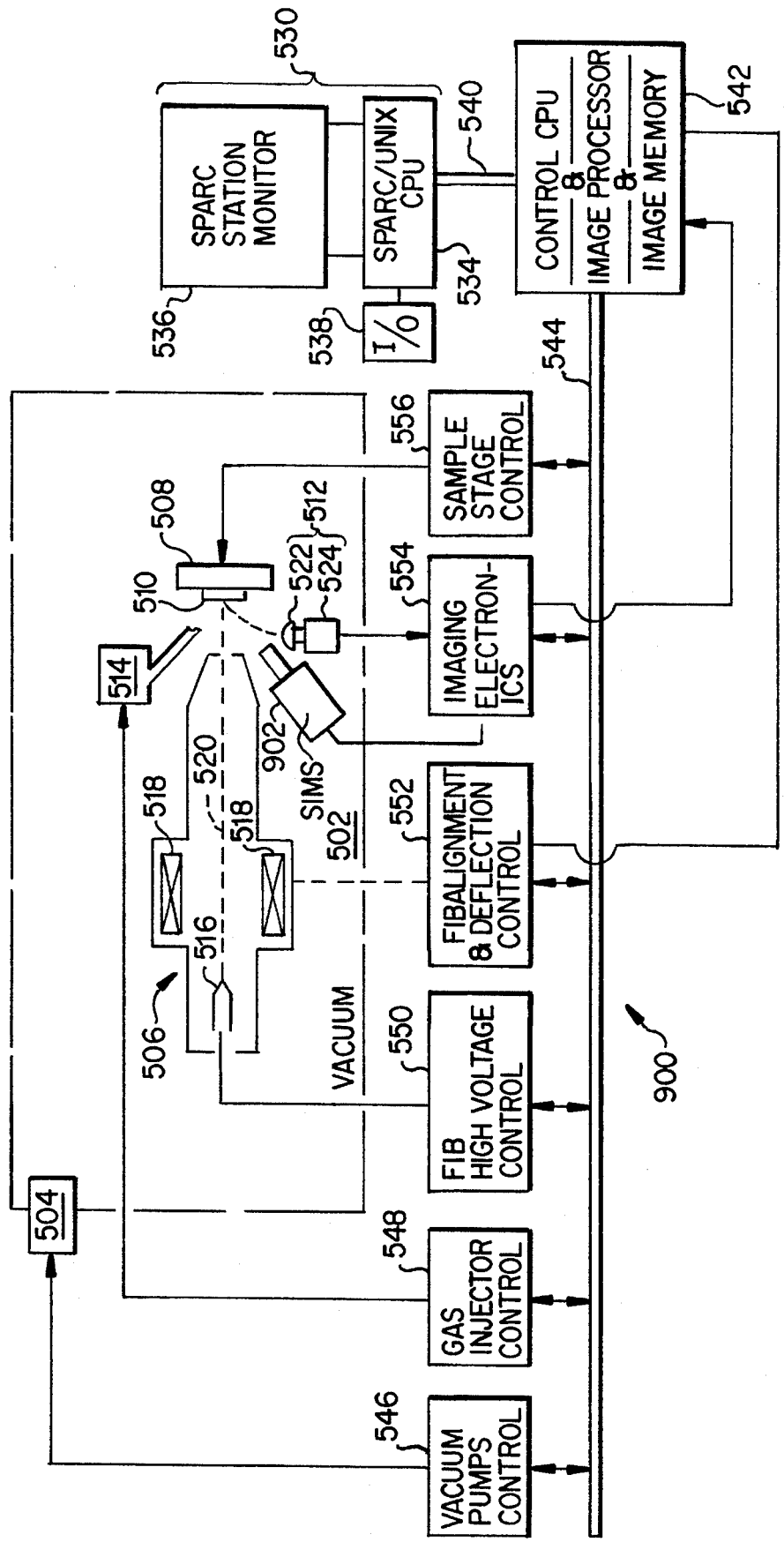
FIG. 9 is a schematic of a FIB system having SIMS imaging means.

FIG. 9 shows a modified version 900 of the system of FIG. 5 in which like parts are shown with like reference numerals. The modification comprises addition of a secondary ion mass spectroscopy detector 902, the output signal of which is supplied to imaging electronics 554. The signal from detector 902 allows elemental materials of sample 510 to be distinguished and is used to generate an image of the sample in a manner which differentiates the elements. Such an image can be used to prepare a mask for selective milling of specific materials, e.g., for selectively milling aluminum and dielectric while minimizing milling of tungsten as in the example of FIGS. 8*a*–8*p*.

Figure 10:
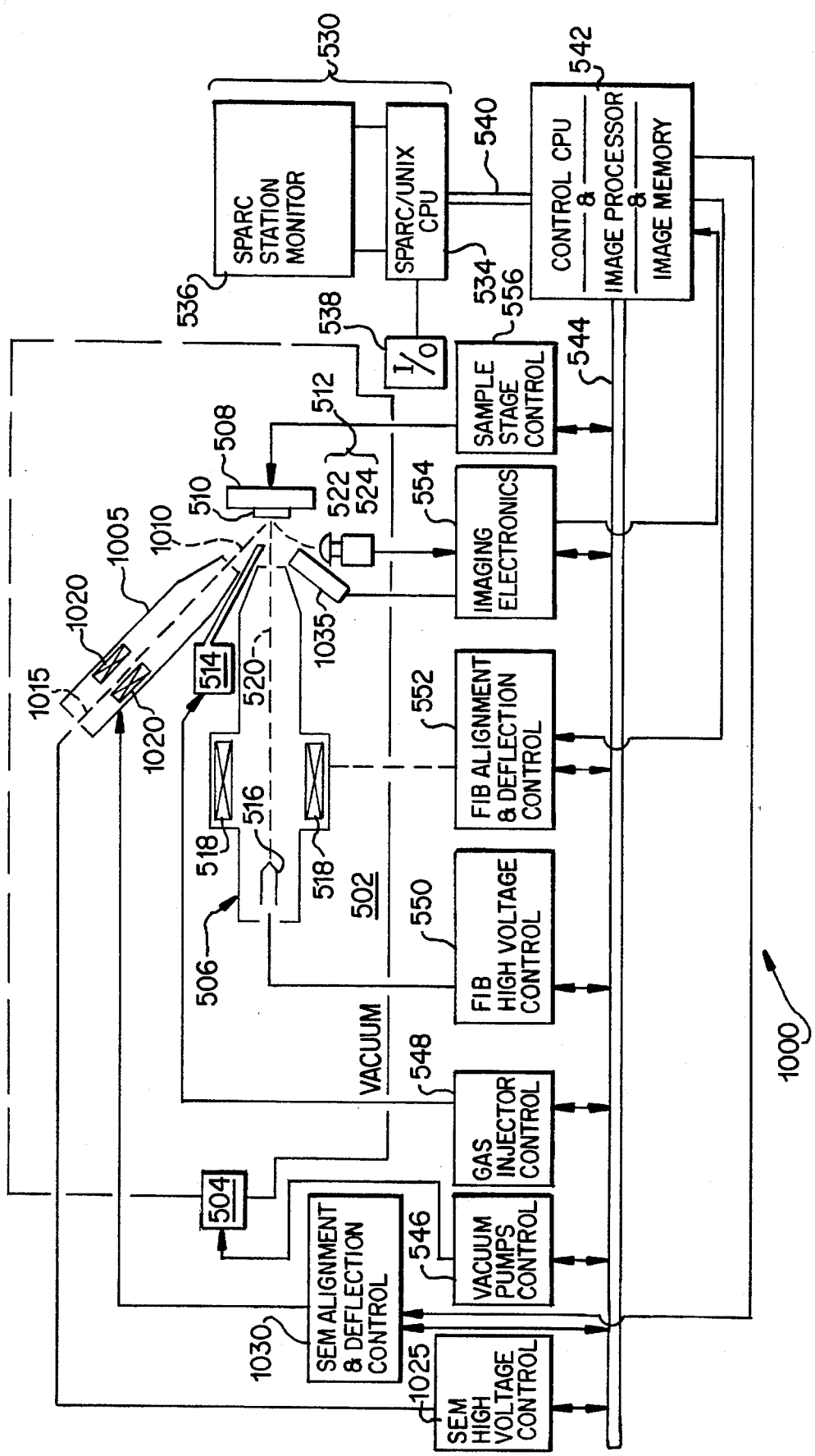
FIG. 10 is a schematic of a FIB system having Auger or EDX imaging means.

FIG. 10 shows a further modified version 1000 of the system of FIG. 5 which includes structure for imaging specimen 510 using Auger or EDX techniques. An electron-optical column 1005 directs a beam of electrons 1010 at specimen 510. Column 1005 includes a source 1015 and alignment/deflection coils 1020. E-beam energy is controlled by SEM high-voltage control 1025, while e-beam alignment and deflection are controlled by SEM alignment & deflection control 1030. Controls 1025 and 1030 communicate with system control unit 542. A detector 1035 is provided for detecting and analyzing energy of electrons rebounding from sample 510 (if the Auger technique is used) or for detecting X-rays emitted from the atomic elements of sample 510 (if the EDX technique is used). In either case, detector 1035 supplies a signal which allows elemental materials of sample 510 to be distinguished. The signal is use to generate an image of the sample. The elemental image is used to prepare a mask for selective milling, e.g., as in the example of FIGS. 8*a*–8*p*.

Figure 11:
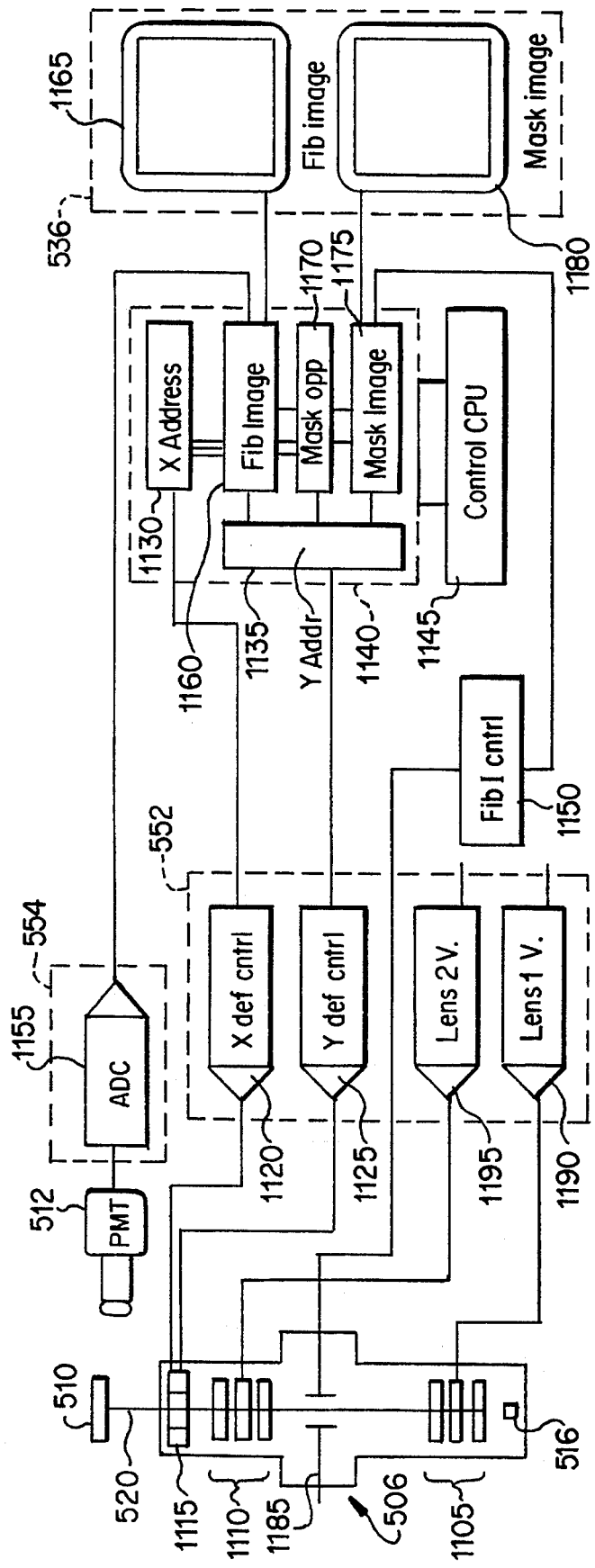
FIGS. 11–13 are schematic diagrams of portions of a FIB system showing various possible ways of performing self-masked milling in accordance with the invention.
Figure 12:
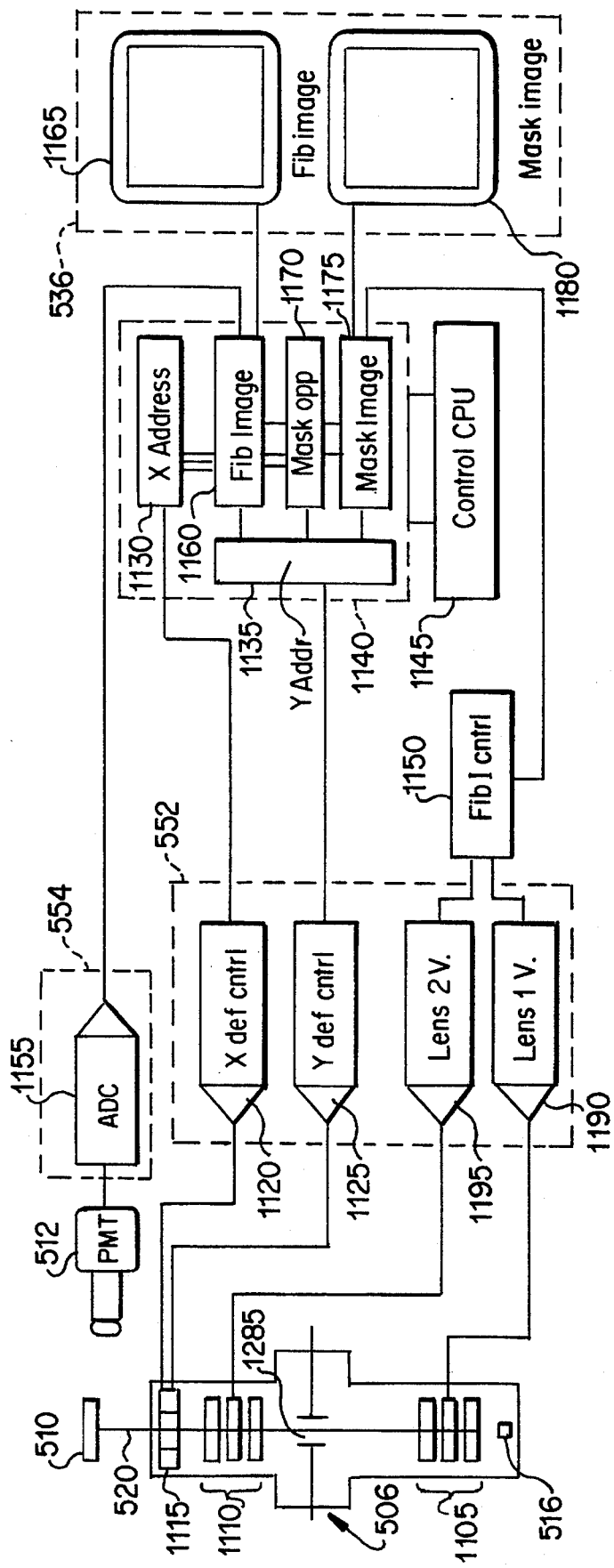
Figure 13:
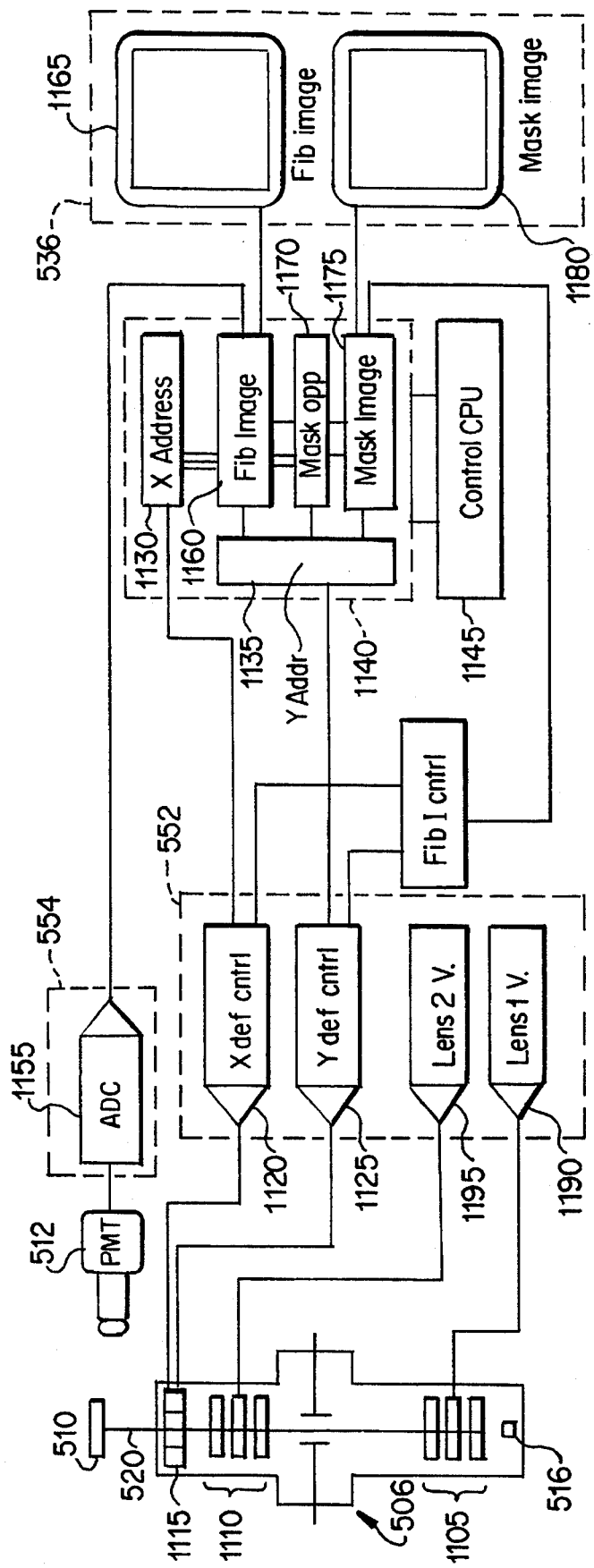
Figure 15:
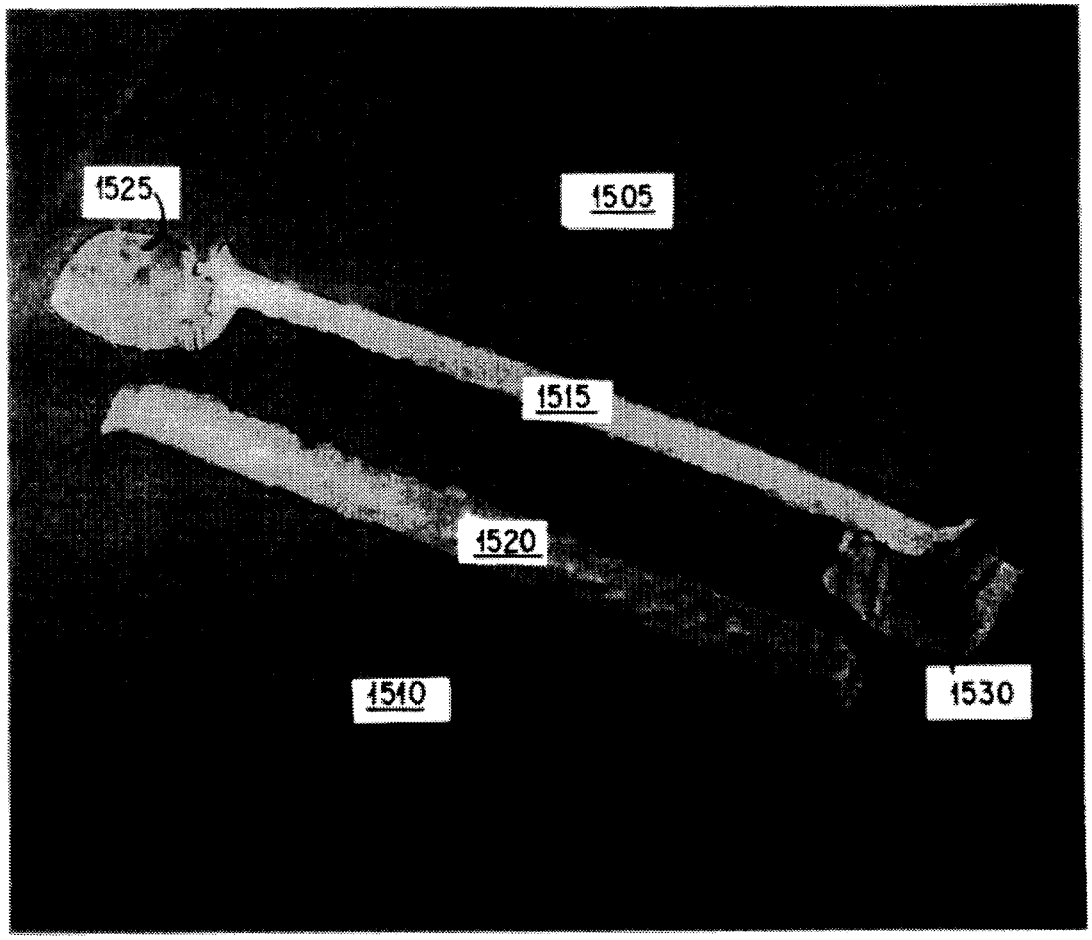
FIG. 15 is a FIB image of a trench milled to cut a power bus using a prior-art method of FIB milling.

FIGS. 11–13 schematically illustrate some possible ways of using a mask to control FIB current for selective milling with a FIB system such as the system of FIG. 5. Like elements are identified with like reference numerals. FIB 520 is directed at sample 510 by FIB column 506. Ions from source 516 are focused by a first ion optical lens 1105 and a second ion optical lens 1110 under control of respective lens voltage sources 1190 and 1195. Deflection elements of an octupole 1115 deflect the FIB in response to deflection voltages supplied by X-deflection control 1120 and Y-deflection control 1125. The deflection voltages are determined by X-address value 1130 and Y-address value 1135 stored in image memory 1140, e.g., in system control unit 542. Control CPU 1145 increments counters containing the X-address and Y-address values to effect scanning of FIB 520 over sample 510. The nominal FIB milling current and raster rate are selected by the user based on the type of material and area to be milled and on the desired accuracy and resolution, as with prior-art FIB milling.

To acquire an image, the FIB current is set to a suitable level, FIB 520 is scanned over sample 510, and signal detector 512 produces a detector signal. The detector signal is converted by A-to-D converter 1155 and stored in image memory 1140 as a set of data 1160 describing a FIB image. The FIB image can be displayed in a FIB image window 1165 of monitor 536. (A SIMS detector 902 can be substituted as in FIG. 9 or an EDX or Auger detector 1035 can be substituted as in FIG. 10, for producing an elemental contrast image instead of a FIB image. For clarity of description, FIGS. 11–13 assume the use of a secondary particle detector for producing a FIB image.) Individual pixel values of stored FIB image data 1160 are thresholded and stored in image memory 1140. A stored set of data 1170 describes operations to be performed in producing from the FIB image data 1160 a set of data 1175 defining the mask image. Image memory 1140 stores the data 1175 which defines the mask image. Other processing can also be performed in producing the mask image, such as masking out window edges or other areas where selective milling is to be avoided. Mask image data 1175 is used to control further milling and can be displayed in a mask image window 1180 of monitor 536.

The mask image data can be used in a variety of ways to control effective FIB milling current. One way is shown in FIG. 11. The binary value of mask image data 1175 at each X–Y address is used as an input signal to FIB current controller 1150, which in turn provides a blanking signal to a beam blanker 1185. The beam is unblanked to maintain effective FIB milling current at a high level when FIB 520 is scanned over X–Y regions of sample 510 to be milled and is blanked to maintain effective FIB milling current at a reduced level when scanned over X–Y regions where milling is to be minimized.

Another way of controlling effective FIB milling current with mask image data is shown in FIG. 12. The binary value of mask image data 1175 at each X–Y address is used as an input signal to FIB current controller 1250, which in turn provides control signals to first lens voltage supply 1190 and to second lens voltage supply 1195. The effective milling current of FIB 520 is controlled by adjusting the properties of the first and second ion-optical lenses 1105 and 1110, e.g., to shift the conjugate point of the ion-optical lens pair relative to a beam-limiting aperture 1285. Effective FIB milling current is maintained at a high level when FIB 520 is scanned over X–Y regions of sample 510 to be milled and is reduced when the beam is scanned over X–Y regions at which milling is to be minimized.

FIG. 13 shows another preferred way of controlling effective FIB milling current with mask image data. The binary value of mask image data 1175 at each X–Y address is used as an input signal to FIB current controller 1250, which in turn provides control signals to X-deflection controller 1120 and Y-deflection controller 1125. FIB current is maintained constant while the scan rate of FIB 520 is adjusted to provide for a longer dwell (and thus a higher milling rate) over X–Y regions to be milled, and a reduced dwell (with reduced milling rate) over X–Y regions at which milling is to be minimized. The binary values of mask image data 1175 thus control milling rate by controlling dwell at each X–Y address.

A preferred method of self-masked milling can be summarized as follows:

1. Place a sample in a vacuum chamber, evacuate the chamber, scan a FIB over the sample, and identify a region of the sample to be milled.
2. Define and start milling a window in the specimen with the FIB.
3. Stop milling manually or automatically when:
   a. Estimated time to desired end-point has elapsed, or
   b. Metal begins to appear under dielectric in contrast image (e.g., where a contact or probe hole is to be cut to expose metal), or
   c. Dielectric begins to appear under metal in contrast image (e.g., where a metal line is to be cut or a window is to be cut through an upper metal layer), or
   d. Ragged hole edges are exposed, or
   e. Surface topography caused by preferential milling becomes visible in a contrast image, or
   f. Contrast image exhibits other gray scale information useful for masked milling.
4. Acquire data defining a contrast image of the specimen.
5. Process the contrast image data to produce mask image data.
   a. Apply threshold value(s) to contrast image data to produce mask image data.
   b. (Optional.) Modify the mask image data such as by masking out mask image areas which are enhanced due to topographical features (e.g., sloping edges of milled window).
   c. Determine mapping of mask image to FIB modulation (e.g., to expose metal layer, mill only dielectric as represented by dark areas of the mask image; to cut window in metal layer, mill only metal as represented by bright areas of the mask image; to clean up jagged areas, mill only specified regions)
6. (As necessary.) Align the mask data with the beam position at milling current, or vice versa, to compensate for offset resulting from use of a different beam current for milling as for image acquisition.
7. Control effective FIB milling current using mask image data.
   a. (Optional.) Copy mask image data to FIB raster control buffer.
   b. Supply output of FIB raster control buffer to FIB intensity or current or scan control (e.g., beam current controlled by beam blanking, by conjugate-point shifting relative to aperture, or by varying raster-scan rate).
8. Resume milling by raster-scanning the FIB over tire defined area while controlling effective FIB milling intensity using mask image.
9. Repeat steps 3.–8. until milling is completed. E.g., if exposing a metal layer, the desired result is achieved when tire milled region is all bright; if exposing a dielectric layer, when all dark; if cleaning up jagged edges, when reduced to a desired level as determined by the user. Preferential milling is thus compensated, preventing tire exaggeration of surface holes and pitting and the like.

A variety of methods can be employed to determine when to prepare and begin using a mask or mask data for selective milling. For example, the operator can rely on experience and/or on nominal layer thicknesses and milling rates and/or on visual examination of an acquired image of the specimen. Normal FIB end-point detection techniques can also be used, e.g., monitoring for change in the secondary particle count. If SIMS or Auger or EDX detection techniques are employed, monitoring changes in atomic composition can signal partial exposure of a layer.

As noted above, a new image can be acquired from time to time to update the mask and adapt it to tire changing milled surface in a closed-loop process. The mask can be updated as a function of the structure milled, e.g., the mask is updated as each layer is exposed where multiple layers are to be milled away in sequence. The mask can be updated at periods ranging from milliseconds to tens or even hundreds of seconds, depending on the area being milled, milling rate, beam current, and the like.

If desired, the mask can be updated continuously as milling progresses. For example, the secondary-particle signal can be collected and analyzed each time the FIB is rastered over the area, and used to generate or update the mask or a part of the mask. Data acquired during milling can be used to update the mask either a frame at a time or a line at a time or a point at a time.

The FIB can be raster-scanned over the area to be milled in sets of interlaced lines. For example, during a first pass the FIB is set at a high current and scanned at a low scan rate on odd-numbered lines for milling, and during a second pass the FIB is set at a lower current and scanned at a higher rate on even-numbered lines for image-acquisition. During a third pass the FIB is set at a low current and scanned at a high rate on odd-numbered lines for image-acquisition, and during a fourth pass the FIB is set at a high current and scanned at a low rate on even-numbered lines for milling. Varying the beam current and scan rate in this way permits almost continuous updating of the mask as milling progresses. The contrast image used to generate the mask can be prepared and updated by using a pixel-by-pixel "rolling" average from a predetermined number of passes. In this context, a pixel need not correspond to a location within a displayed image, but preferably does correspond to an X–Y scan position of the FIB resulting from a given set of deflection voltage inputs to the FIB column.

The mask image need not be prepared and stored as a set of mask image data 1175 as in FIGS. 11–13. The contrast image can instead be processed on the fly to generate a mask-data signal for controlling effective FIB milling current as the milling is conducted. For example, the pixel value at each X–Y location of the contrast image is read from memory in sequence and the pixel value is thresholded to produce a binary (or gray-level) value which is in turn used to control the effective FIB milling current at that X–Y location.

Stage current can be used in lieu of the secondary-particle signal from detector 512 to acquire a contrast image from which the mask image is produced. Stage current is the measured current flow from the sample stage to ground during milling and is the sum of primary ion current plus secondary electron current plus secondary ion current. Primary ion current is fixed and secondary ion current is negligible, so stage current varies mainly with secondary electron current.

The techniques described can be used not only to distinguish metal (e.g., a metal power plane) on dielectric, but also dielectric on metal, dielectric on dielectric, metal on metal, and other contrasts. As used herein, the term "contrast image" is intended to include any image exhibiting materials contrast, topographical contrast and/or voltage contrast. Differential materials contrast at interfaces is particularly useful for controlling milling with mask data in accordance with the invention. The term "contrast image" includes a FIB image; an elemental contrast image such as a SIMS, Auger or EDX image (e.g., where milling is to occur only in the presence or absence of a particular element or combination of elements); a SEM image; and/or an optical image. Resolution of an optical image may be inadequate, though, for distinguishing features of less than about a micron. By "FIB image" is meant an image generated with the aid of a FIB including, but not limited to, a secondary ion image or a secondary-electron image.

Elemental contrast images (such as produced by SIMS, EDX, Auger or other techniques) can be exploited in accordance with the invention for milling away a particular element, or combination of elements, or a particular ratio of elements in a selected combination. For example, an elemental contrast image can be used to prepare mask data for FIB removal of a volume having a specific dope concentration such as the drain or source region of an MOS transistor. Conversely, an elemental contrast image can be used to prepare mask data for FIB removal of material other than a particular element, combination of elements or ratio of elements.

It is possible under certain imaging conditions (typically, vacuum better than $10^{-6}$ Torr, preferably $10^{-7}$ Torr, and at a low beam-rastering rate) to obtain a contrast image exhibiting grain structure of the sample. Such contrast is also referred to as channeling contrast. Such an image can be used to produce mask data which allows particular grain orientations to be selectively milled using the techniques of the present invention.

Acquired contrast images or the image masks can be used to compensate image shifts which can occur over time or with changes in beam current during the milling process. The actual location at which the FIB impinges on the sample for a given X–Y coordinate location in memory can drift for any of a number of reasons. By comparing the latest contrast image or image mask of the sample with an earlier-acquired contrast image or image mask of the sample, an offset between the images can be determined and used to correct for this drift. Milling accuracy is thus enhanced. U.S. patent application Ser. No. 08/031,547 filed Mar. 15, 1993 of Richard Dean Barnard (the content of which is incorporated herein by this reference) describes methods for determining offset between images of an IC device. The methods can even be used to determine offset between images of different kinds, such as between a contrast image of a sample and a mask image of the sample.

As described, the acquired image is binarized by thresholding to create the mask in the form of an on/off map for the masked milling process. Gray levels could similarly be used (rather than binary levels) to control the effective milling intensity of the FIB. That is, effective FIB milling current can be controlled by such means as blanking the FIB or varying the raster-scan rate of the FIB as a function of gray level of the mask data. The FIB can also be vectored to a specific location or set of locations to be milled. Just as the threshold used for creating a binary map can be user-defined, the mapping between gray levels of the image and the effective FIB milling intensity can be user-defined and need not be linear.

Other methods of deriving mask data are also possible. For example, a topographical contrast image may show only the edges of a topographical feature, so it may be desirable to "fill in" the areas defined by the edges when preparing a mask or mask data. If the edges define the perimeter of a feature, the contrast image can be edited to fill in the feature before preparing mask data.

An example is illustrated in FIGS. 16a–16f. A conductor 1410 (FIG. 14a) is to be severed by FIB milling The boundaries of a "cut box" 1445 are established (FIG. 14b), such as by defining the box on a displayed FIB image. The portion of the FIB image lying within the "cut box" boundaries is taken as a starting point for preparing a mask. It is not desired to mill over the entire area defined by the "cut box", but instead to mill only over the region of the "cut box" which overlaps conductor 1410; that is, the region to be milled is defined by the central portion of the "cut box" lying between topographical contrast lines 1435 and 1440. An initial mask 1605, shown in FIG. 16c, is prepared from that portion of the FIB image of FIG. 14b lying within "cut box" 1445 by filling in the region between contrast lines 1435 and 1440. As shown in the section view of FIG. 16a, FIB 1610 is then scanned to mill between limits 1615 and 1620. Pitting at the edges of conductor 1410, e.g., at locations 1625 and 1630, is limited by use of the mask.

After milling for some time, a fresh FIB image is acquired as in FIG. 16b. The milled trench appears in the image as upper and lower topographical contrast lines 1635 and 1640, possible outer topographical contrast lines 1645 and 1650, and clearly-defined contrast lines 1655 and 1660 (due to combined topographical and materials contrast) at the exposed edges of conductor 1410. A fresh milling mask 1665, shown in FIG. 16f, is then prepared from that portion of the FIB image of FIG. 16b lying within "cut box" 1445 by filling in the region between contrast lines 1655 and 1660. FIB milling resumes using mask 1665 to define new scan limits 1670 and 1675. For optimum milling accuracy, it is preferred to update the milling mask (or mask data in lieu of a mask) from time to time during the milling process.

It will be recognized by those of skill in the an that the operation of filling in the region between contrast lines 1435 and 1440 for preparation of mask 1605 and between contrast lines 1655 and 1660 for preparation of mask 1665 may be done either manually or automatically using conventional image-editing techniques. Computerized image processing and display systems are known which provide a variety of editing capabilities such as the ability to edit an image pixel-by-pixel, or to fill in a region defined by selected boundary lines. Mask updating can be automated for example by defining a preset boundary line contrast level for the image contrast lines to be used as boundary lines for the mask. Upon acquisition of a FIB image such as that of FIG. 16b, a suitably preset contrast level allows automatic selection of contrast lines 1655 and 1660 as boundaries for mask 1655. Image-processing techniques useful in automating mask data preparation are discussed in texts such as D. BALLARD et al., COMPUTER VISION, Prentice Hall, ISBN 0-13-165316 (particularly sub-section 4.6 on "Contour Following") and J. Russ, THE IMAGE PROCESSING HANDBOOK, CRC Press, ISBN 0-8493-4233-3 (particularly Chapter 6 on "Processing Binary Images").

Self-masked milling techniques of the present invention can be advantageously combined with the use of one or more chemicals for enhanced and/or differential FIB etching, e.g., as described in U.S. Pat. No. 5,055,696. Similarly, self-masked milling techniques of the present invention can be employed in electron-beam chemically-induced etching, in which an electron beam is used in place of a FIB to effect etching in the presence of a suitable chemical or chemicals.

It is also known to use a FIB (such as a silicon ion beam) or other particle beam in combination with a suitable chemical for depositing a layer on the device. See, for example, H. KOMANO el al., JAPANESE JOURNAL OF APPLIED PHYSICS, Vol. 28, No. 11 (November 1989), pp. 2372–2375. The self-masking technique of the invention can be used to lay down a consistent layer, such as an insulator layer. In this case, a materials contrast image is used to determine that an insulating layer is intact.

Figure 1A:
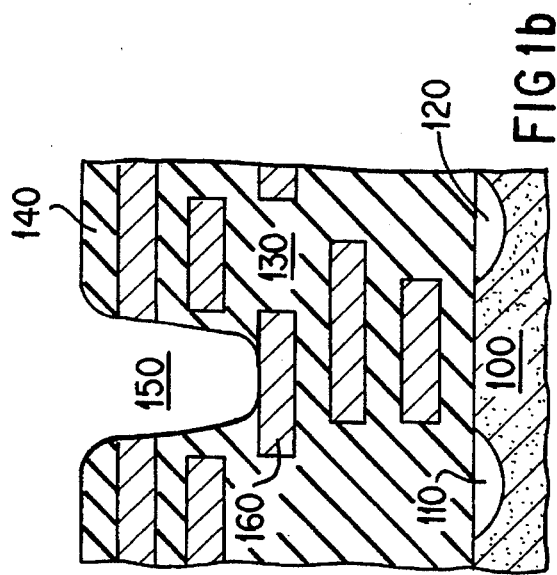
FIGS. 1a–1d illustrate a typical problem with prior-art FIB milling of a sample.
Figure 1B:
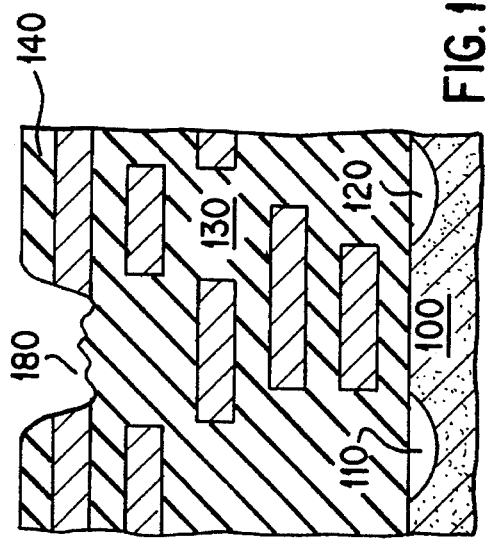
Figure 1C:
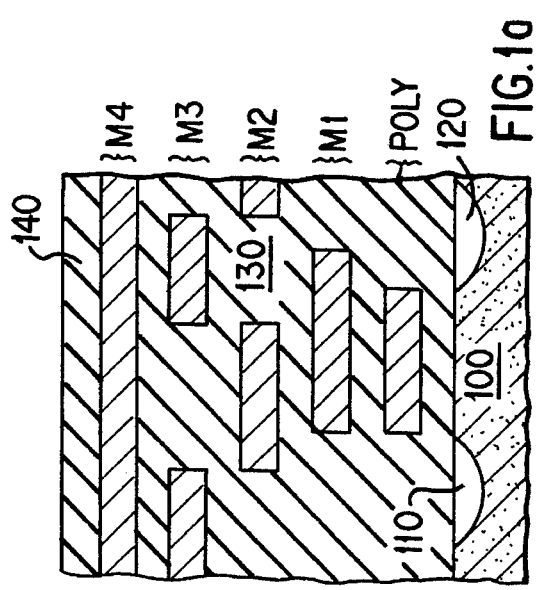
Figure 1D:
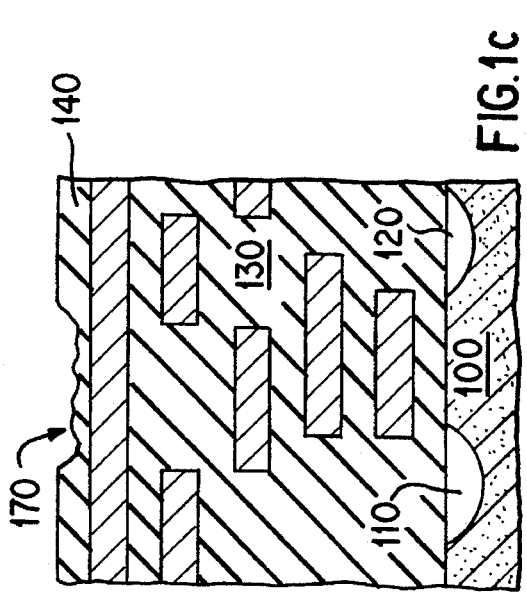
Figure 2:
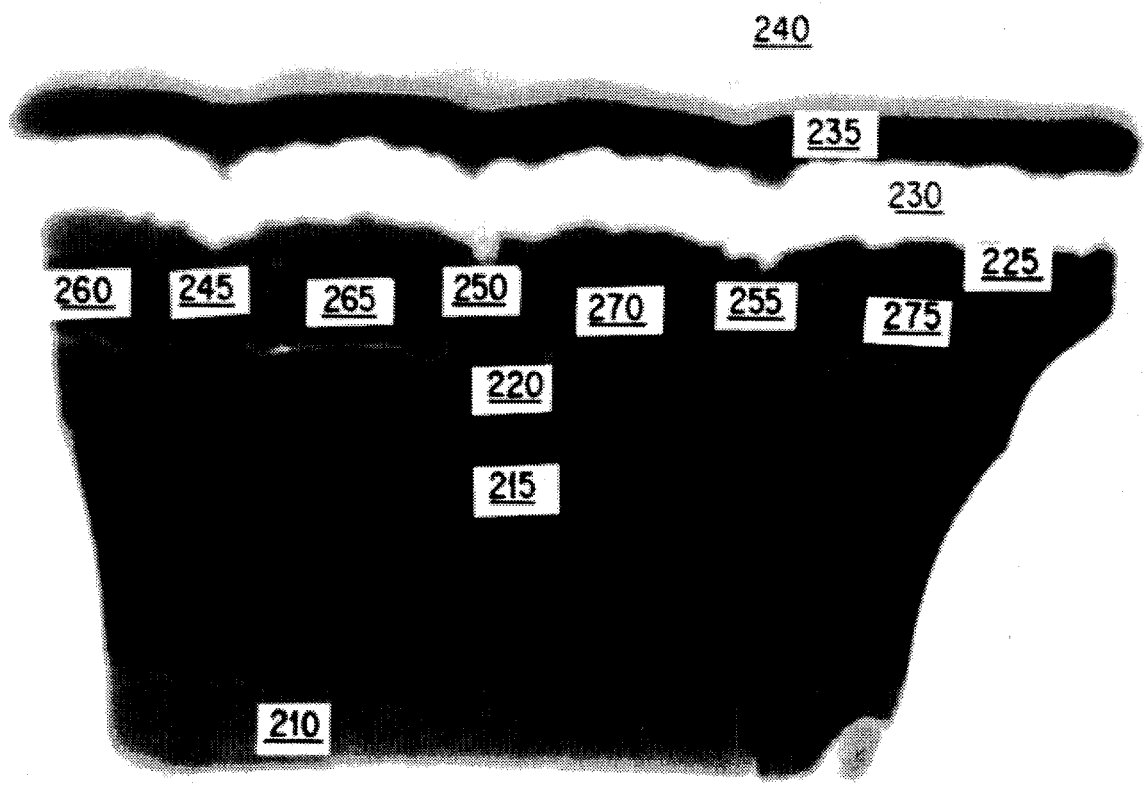
FIG. 2 is a FIB image of portion of a device which has been coated with metal and sectioned.
Figure 3:
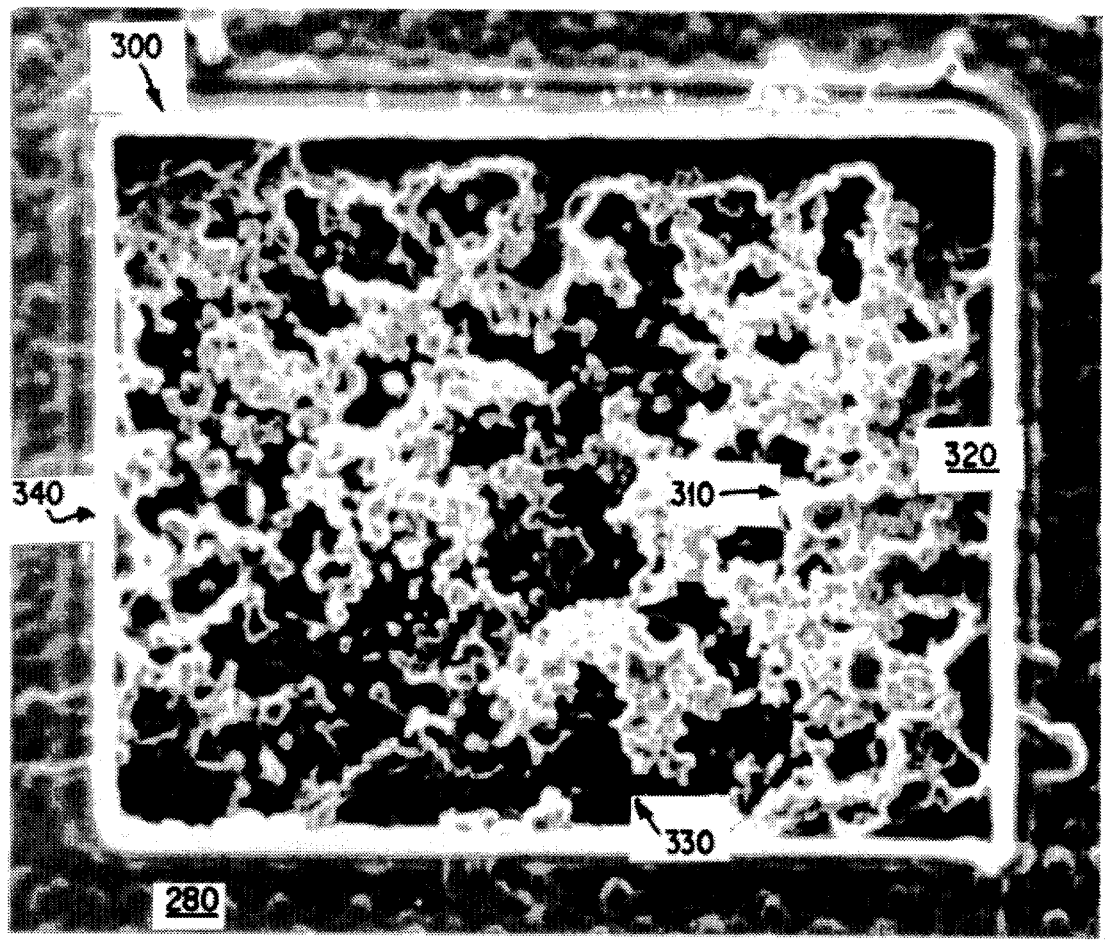
FIG. 3 is a FIB image of the device of FIG. 2 after a FIB has been used to begin milling a window.
Figure 4:
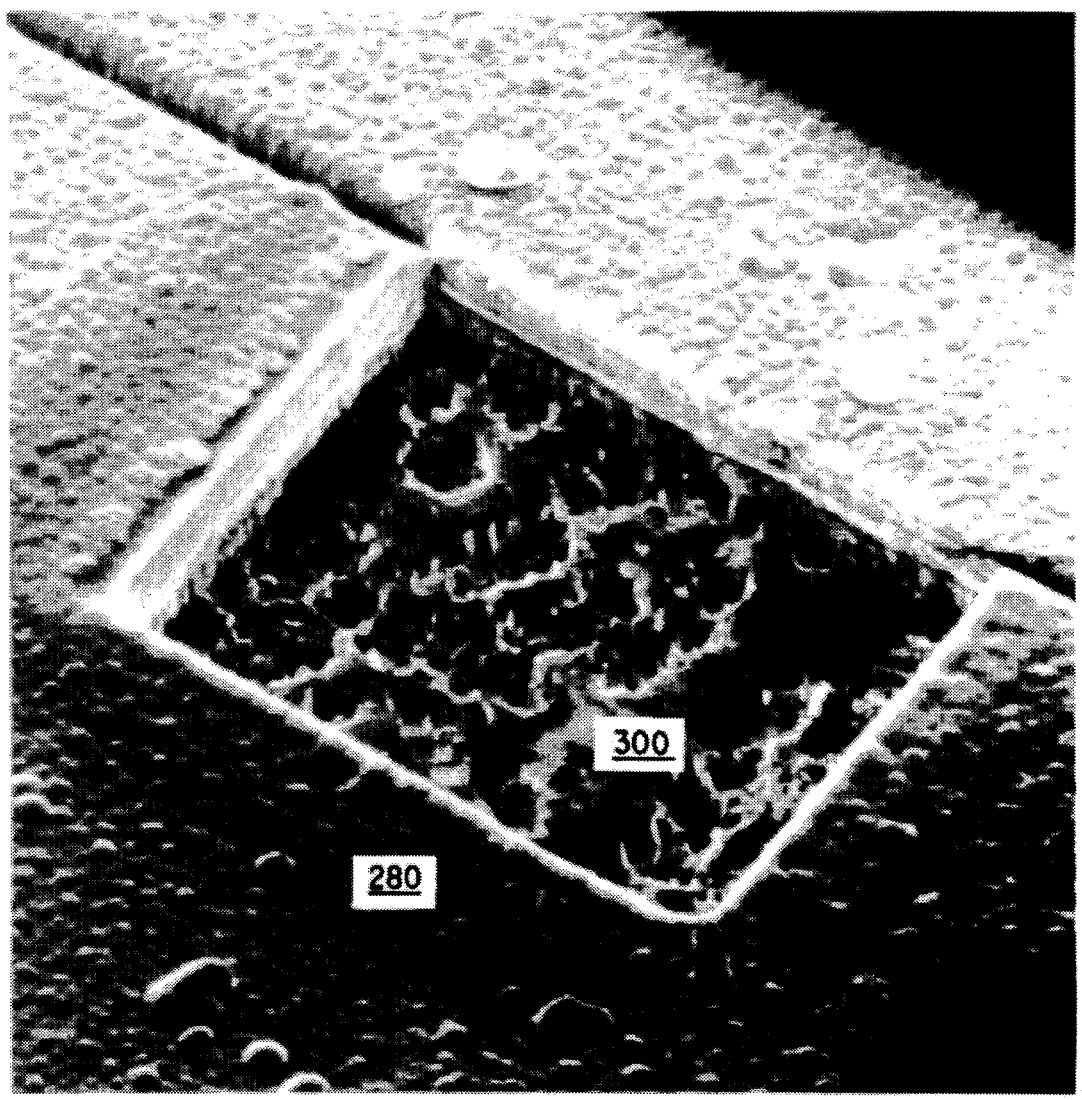
FIG. 4 is a FIB image of the device of FIG. 3 after further FIB milling.

In the examples given, the contrast image used to prepare a mask or mask data is shown as taken from a view which is substantially normal to the surface of the sample being treated. It will be recognized that the imaging system can also be used to acquire an image at other angles to the surface of the sample (e.g., a SEM at 45 degrees to the surface) to aid interpretation of topographic contrast. For example, the image of FIG. 4 is acquired from a view other than normal to the surface of the sample and offers good topographic contrast. Information from such non-normal images can be used to create or process mask data.

It is sometimes desired to depassivate all or pan of an IC to facilitate debug and/or failure analysis. Known techniques use reactive ion etching (PIE) to globally depassivate an IC, such as disclosed in U.S. Pat. Nos. 4,961,812 and 4,980,019 to Baerg et al. These techniques are have a number of disadvantages. They are complex and operator-dependent, requiring a skilled operator and a carefully characterized process. PIE global depassivation changes the dielectric constant for the whole IC and thus changes the timing characteristics of circuits. This can mask IC failures. PIE global depassivation sometimes removes particles captured in the dielectric during fabrication, eliminating or masking the failure of interest. RIE global depassivation is also relatively slow, requiring 90 minutes to 2 hours for a typical microprocessor.

It is known to accelerate FIB milling by injecting a halogen-based gas close to the device surface. The specific characteristics of the process depend on the gas injected and the type of material being milled. Benefits include accelerated material removal, material-dependent mill rates which permit material-selective milling, and reduced redeposition which produces cleaner cuts and higher aspect-ratio holes and side-walls. Xenon difluoride, $XeF_2$, is an example of a gas which accelerates the FIB removal of dielectric materials often used in ICs, such as $SiO_2$ and $Si_3N_4$. Differential material-removal rates from 3:1 to 10:1 as compared for aluminum signal-lines are readily achieved.

Figure 17:
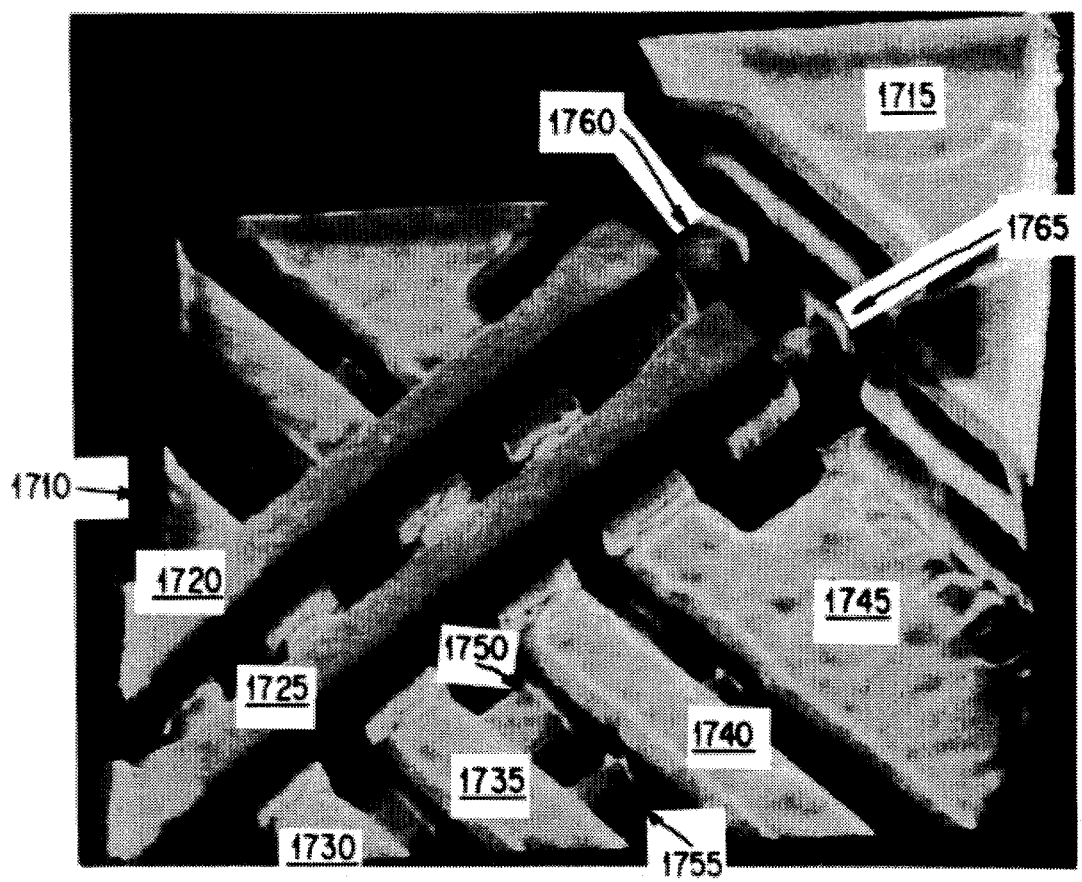
FIG. 17 is a FIB image showing a "window" in a multi-layer device which has been locally-depassivated by dielectric-preferential FIB milling.

This material-selectivity property is valuable for local depassivation of IC signal lines for improving electron-beam prober signal integrity. During the FIB milling process with $XeF_2$, the material removal rate is less in those areas where aluminum/metal conductors are exposed. As milling continues, more and more dielectric is removed, leaving the aluminum conductors standing on "plateaus" of dielectric formed as a result of the conductors "masking" the ion beam from the underlying dielectric. For example, FIG. 17 is a FIB image showing a "window" 1710 in a multi-layer device which has been locally-depassivated by dielectric-preferential FIB milling using $XeF_2$ in a CAIBE process to expose metal-4 conductor 1715, metal-3 conductors 1720 and 1725, metal-2 conductors 1730, 1735, 1740 and 1745, and metal-1 conductors 1750 and 1755.

Figure 18:
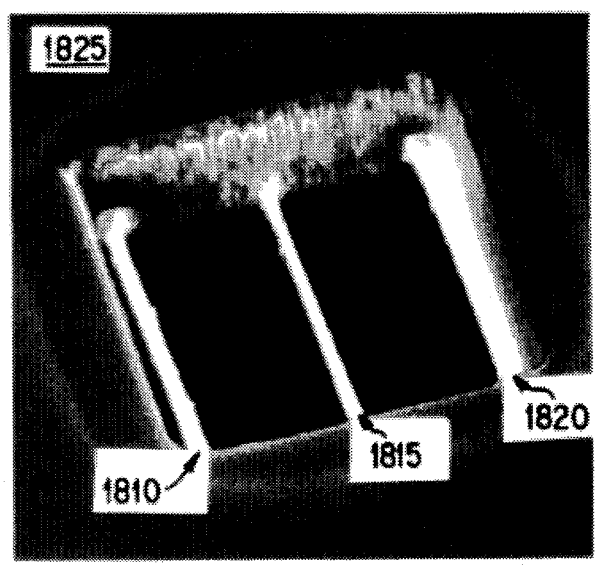
FIG. 18 is a FIB image showing an example with top-level conductors of an IC narrowed by over-etching due to low milling rate of polyimide passivation.

This de-passivation process works well for one- and two-layer metal devices which use $SiO_2$ and $Si_3N_4$ as dielectric and passivation materials. However, in the case of three- and four-layer metal devices, upper-level exposed conductors can be damaged or cut by the extended FIB exposure that is necessary to remove dielectric from lower layers. FIG. 17 shows, for example, damage to metal-3 conductors 1720 and 1725 at 1760 and 1765, respectively. Damage can also occur with dielectric materials which mill slowly, such as polyimide. FIG. 18 is a FIB image showing an example in which top-level conductors 1810, 1815 and 1820 of a device have been narrowed by over-etching due to the slow milling rate of polyimide passivation 1825 in the $XeF_2$-assisted FIB etching process.

Self-masked FIB milling in accordance with the invention can be used to reduce damage caused by passivation removal, especially from a selected, local region. In accordance with the invention, a FIB-generated adaptive mask is used to select against milling of metal as the metal is progressively exposed. Local depassivation using self-masked FIB milling in accordance with the invention has the advantages that: the operation is substantially independent of operator skill, little or no pre-characterization is required, the chances of removing a particle embedded in the passivation are substantially reduced, and the dielectric constant of the dielectric seen by the whole IC is not significantly changed.

Depassivation by self-masked milling can be performed with or without the aid of a dielectric-preferential gas. While self-masked FIB milling alone is effective for exposing conductors, the use of self-masked milling in combination with CAIBE using material-selective gas has a number of advantages: material redeposition which can induce leakage currents between conductors is reduced, end-point detection is made easier especially for milling deep passivation, higher aspect-ratios can be achieved to facilitate exposing lower-level conductors in tight areas where conductors are densely routed, and milling proceeds more quickly.

Figure 19A:
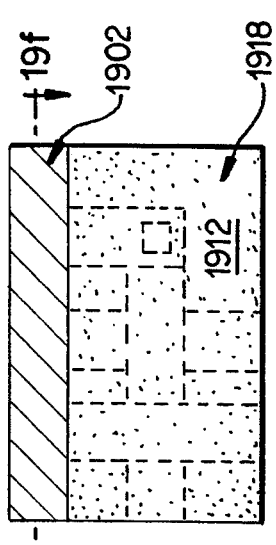
FIGS. 19a–19o illustrate a method of self-masked FIB milling for local depassivation of an IC in accordance with the invention.
Figure 19D:
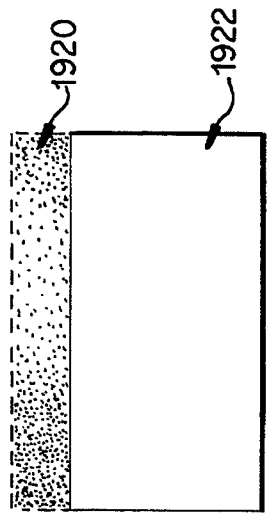
Figure 19E:
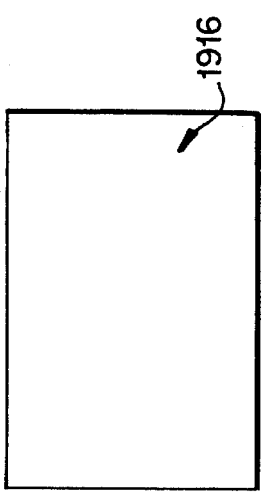
Figure 19B:
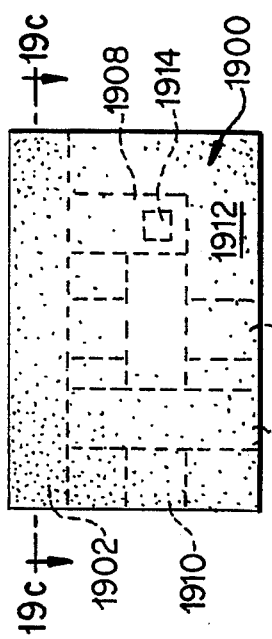
Figure 19C:
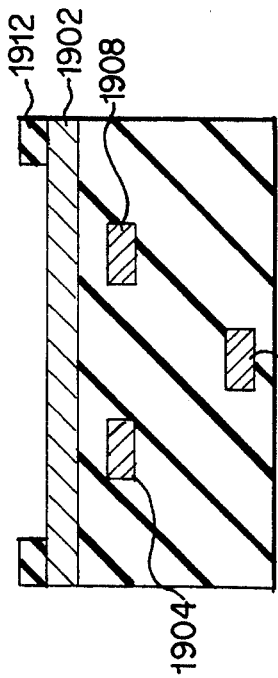
Figure 19F:
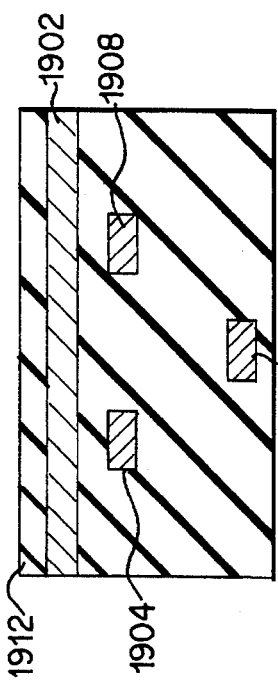
Figure 19M:
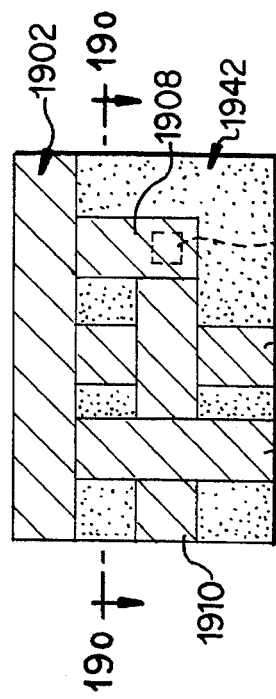
Figure 19N:
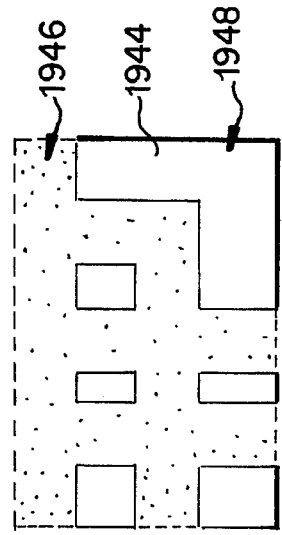
Figure 19O:
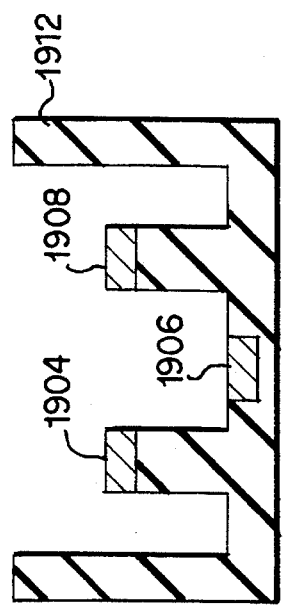

FIGS. 19a–19o show an example of a process for local de-passivation of an IC in accordance with the invention. FIG. 19a shows a typical FIB image represented by a shaded rectangle 1900 with an overlay showing outlines of buried conductors 1902, 1904, 1906, 1908 and 1910 under a passivation layer 1912 and with a via 1914 connecting conductors 1908 and 1910. FIG. 19b shows a white rectangle 1916 representing the initial mask (a null mask or no mask to start the process). In later steps the mask is generated by thresholding the FIB image. FIG. 19c is a cross-sectional view taken along line 19c—19c of FIG. 19a. FIB milling (with or without $XeF_2$) is performed to locally depassivate the region shown in the FIB image of FIG. 19a. FIG. 19d shows a resulting FIB image 1918 in which aluminum of conductor 1902 is exposed. FIG. 19f is a cross-sectional view taken along line 19f—19f of FIG. 19d. As shown in FIG. 19e, a dark masking area 1920 is generated (by thresholding and inverting the FIB image of FIG. 19f) and the mask 1924 is then used during further milling to avoid milling the exposed metal of conductor 1902.

FIB milling (with or without $XeF_2$) continues using the mask of FIG. 19e. FIG. 19g shows a resulting FIB image 1926 in which a second layer of metal is exposed to reveal conductors 1904 and 1908. FIG. 19i is a cross-sectional view taken along line 19i—19i of FIG. 19g. Once the metal of conductors 1904 and 1908 is exposed, the FIB image of FIG. 19g is used to generate a mask 1928 as in FIG. 19h for further milling which avoids milling the exposed metal of conductors 1902, 1904 and 1908. Region 1930 of mask 1928 is to be masked during further milling, while region 1932 is to be milled.

The process is continued until all metal layers of interest are exposed. For example, FIB milling (with or without $XeF_2$) continues using the mask of FIG. 19h. FIG. 19j shows a resulting FIB image 1934 in which a third layer of metal is exposed to reveal conductor 1910. FIG. 19l is a cross-sectional view taken along line 19l—19l of FIG. 19j. Once the metal of conductor 1910 is exposed, the FIB image of FIG. 19j is used to generate a mask 1936 as in FIG. 19k for further milling which avoids milling the exposed metal of Conductors 1902, 1904, 1908 and 1910. Region 1938 of mask 1936 is to be masked during further milling, while region 1940 is to be milled.

FIB milling (with or without XeF$_2$) continues using the mask of FIG. 19k. FIG. 19m shows a resulting FIB image 1942 in which a fourth layer of metal is exposed to reveal conductor 1906. FIG. 19o is a cross-sectional view taken along line 19o—19o of FIG. 19m. Once the metal of conductor 1906 is exposed, the FIB image of FIG. 19j can be used to generate a mask 1944 as in FIG. 19n if further milling is to be done while avoiding milling the exposed metal of conductors 1902, 1904, 1908, 1910 and 1906. In this case, region 1946 of mask 1944 is masked during further milling, while region 1948 is milled.

The foregoing description of preferred embodiments of the invention is intended as illustrative only, and not as a limitation of the invention as defined by the claims which follow. Those of skill in the art will recognize many modifications which may be made in the preferred embodiments within the spirit and scope of the claimed invention.

We claim:

1. A method of modifying an integrated circuit specimen, comprising the steps of:
    a. scanning a focused particle beam over a surface of a specimen to mill material from the surface;
    b. preparing a set of data representing an image of the surface, the image having a first image portion representing an area of passivation and/or dielectric to be milled further and a second image portion representing an area of metal over which further milling is to be minimized;
    c. scanning the focused particle beam over the surface while controlling the focused particle beam to selectively mill further the area represented in the first image portion and to minimize further milling of the area represented in the second image portion; and
    d. updating the set of data representing an image of the surface to thereby adapt the milling of the surface to changes occurring as the surface is milled.

2. The method of claim 1, wherein step c. further comprises the step of introducing a chemical at the surface to preferentially enhance milling rate of passivation and dielectric from the surface relative to milling rate of metal.

3. The method of claim 1, wherein step c. further comprises the step of introducing xenon difluoride (XeF$_2$) gas at the surface to preferentially enhance milling rate of passivation and dielectric from the surface relative to milling rate of metal.

4. A method of depassivating conductors within a selected region of an integrated circuit specimen, comprising the steps of:
    a. scanning a focused ion beam over a surface of an integrated circuit specimen to mill material from the surface;
    b. preparing a set of data representing an image of the surface, the image having a first image portion representing an area of dielectric material and a second image portion representing at least one conductor;
    c. scanning the focused ion beam over the surface while controlling the focused particle beam to selectively mill the area represented in the first image portion and to minimize milling of the area represented in the second image portion; and
    d. repeating steps b. and c. a plurality of times so that the focused ion beam preferentially mills dielectric material to thereby expose conductors of the specimen.

5. The method of claim 4, further comprising repeating steps b. and c. until conductors of multiple layers of the integrated circuit specimen are exposed within the selected region.

6. The method of claim 5, wherein step c. further comprises the step of introducing a chemical at the surface to preferentially enhance milling rate of passivation and dielectric from the surface relative to milling rate of metal.

7. The method of claim 5, wherein step c. further comprises the step of introducing xenon difluoride (XeF$_2$) gas at the surface to preferentially enhance milling rate of passivation and dielectric from the surface relative to milling rate of metal.

8. A method of modifying a specimen, comprising the steps of:
    a. scanning a focused particle beam over a surface of a specimen to mill material from the surface;
    b. preparing a set of data representing an image of the surface, the image having a first image portion representing an area to be milled further and a second image portion representing an area over which further milling is to be minimized, by
        i. acquiring a first set of pixel data defining a contrast image of the surface, the pixel data comprising a respective intensity value for each X–Y location of the image, and
        ii. thresholding the intensity values to produce a set of data defining a mask image having a gray-level value for each X–Y location of the image; and
    c. scanning the focused particle beam over the surface while controlling the focused particle beam to selectively mill further the area represented in the first image portion and to minimize further milling of the area represented in the second image portion, wherein controlling the focused particle beam comprises controlling the effective milling rate of the beam at each X–Y location of the surface in dependence on the set of data defining a mask image.

9. The method of claim 8, further comprising the step of updating the set of data representing an image of the surface to thereby adapt the milling of the surface to changes occurring as the surface is milled.

10. The method of claim 9, wherein the focused particle beam comprises a FIB.

11. The method of claim 10, wherein the FIB has an effective milling current which can be modulated as the FIB is scanned and wherein step c. comprises modulating the effective milling current with said data as a function of the FIB position relative to said areas.

12. The method of claim 11, wherein the effective milling current is modulated by varying scan rate of the FIB.

13. The method of claim 10, wherein step c. comprises unblanking the FIB when scanned over the area represented in the first image portion and blanking the FIB when scanned over the area represented in the second image portion.

14. The method of claim 10, wherein step c. comprises maintaining the FIB at a beam current suitable for milling when scanning over the area represented in the first image portion and blanking the FIB when scanned over the area represented in the second image portion.

15. The method of claim 10, wherein step c. comprises scanning the FIB at a low rate over the area represented in the first image portion and scanning the FIB at a high rate over the area represented in the second image portion.

16. The method of claim 8, wherein thresholding the intensity values comprises producing a binary value for each X–Y location of the image, the binary values comprising a set of data defining the mask image.

17. The method of claim 8, wherein the image comprises a contrast image exhibiting at least one of: topographical features of the surface; materials contrast over the surface;

voltage contrast over the surface; and atomic element contrast over the surface.

18. The method of claim 8, wherein the contrast image data represents contrast between elemental composition of regions of the surface, and wherein step c. comprises selectively milling a region of predetermined elemental composition.

19. The method of claim 8, wherein the focused particle beam is a FIB and wherein step c. further comprises the step of introducing a chemical at the surface to enhance the milling of material from the surface.

20. The method of claim 8, wherein the focused particle beam is an electron beam and wherein step c. further comprises the step of introducing at the surface a chemical which is induced to mill material from the surface in the presence of the electron beam.

21. The method of claim 8, wherein the image comprises a contrast image exhibiting channeling contrast, and wherein said area to be milled further comprises material having a first grain orientation and said area over which further milling is to be minimized comprises material having a second grain orientation.

22. A method of depassivating conductors within a selected region of an integrated circuit specimen having multiple metal layers separated by dielectric layers, comprising the steps of:

a. scanning a focused ion beam over a surface of an integrated circuit specimen to mill material from the surface, to thereby expose a conductor (1902) of a first metal layer;

b. preparing a set of data representing an image of the surface, the image having a first image portion (1922) representing dielectric material and a second image portion (1920) representing the exposed conductor of the first metal layer;

c. scanning the focused ion beam over the surface while controlling the focused particle beam to selectively mill the area of dielectric material represented in the first image portion and to minimize milling of the conductor of the first metal layer represented in the second image portion, to thereby expose a conductor (1904, 1908) of a second metal layer;

d. preparing a set of data representing an updated image of the surface, the updated image having a first image portion (1932) representing dielectric material and second image portions (1930) representing the conductor of the first metal layer and the conductor of the second metal layer; and e. scanning the focused ion beam over the surface while controlling the focused particle beam to selectively mill the dielectric material represented in the first image portion of the updated image and to minimize milling of the conductors of the first and second metal layers represented in the second image portion of the updated image, to thereby expose a conductor (1910) of a third metal layer.

23. The method of claim 22, further comprising the steps of:

f. preparing a set of data representing a further updated image of the surface, the further updated image having a first image portion (1936) representing dielectric material and second image portions (1938) representing the conductor of the first metal layer and the conductor of the second metal layer and the conductor of the third metal layer; and g. scanning the focused ion beam over the surface while controlling the focused particle beam to selectively mill the dielectric material represented in the first image portion of the further updated image and to minimize milling of the conductors of the first and second and third metal layers represented in the second image portion of the further updated image, to thereby expose a conductor (1906) of a fourth metal layer, whereby conductors of multiple metal layers within the selected region of the integrated circuit specimen are depassivated while minimizing damage to the depassivated conductors.

24. A method of removing non-metallic material overlying metal layers of an integrated circuit specimen to expose selected areas of the metal layers, comprising the steps of:

a. scanning a focused ion beam over a surface of an integrated circuit specimen to remove non-metallic material until a first area (1902) of at least one of the metal layers is exposed;

b. preparing an image of the surface having a first image portion (1922) representing non-metallic material and a second image portion (1920) representing the exposed first area of at least one of the metal layers;

c. scanning the focused ion beam over the surface while controlling the focused particle beam to selectively mill the area of non-metallic material represented in the first image portion and to minimize milling of the exposed first area of at least one of the metal layers, until a second area (1904, 1908) of the metal layers is exposed; and d. preparing an updated image of the surface having a first image portion (1932) representing non-metallic material and second image portions (1930) representing the exposed first area (1902) and the exposed second area (1904, 1908) of the metal layers.

25. The method of claim 24, wherein the exposed first area is of a first metal layer and the exposed second area is of a second metal layer separated from the first metal layer by non-metallic material.

26. The method of claim 25, further comprising the steps of:

e. scanning the focused ion beam over the surface while controlling the focused particle beam to selectively mill the non-metallic material represented in the first image portion of the updated image and to minimize milling of the exposed first area and the exposed second area of the metal layers, until a third area (1910) of the metal layers is exposed; and f. preparing a further updated image of the surface having a first image portion (1936) representing non-metallic material and second image portions (1938) representing the exposed first area of the metal layers and the exposed second area of the metal layers and the exposed third area of the metal layers.

27. The method of claim 26, wherein the exposed third area is of a third metal layer separated from the second metal layer by non-metallic material.

* * * * *